(12) United States Patent
Chang et al.

(10) Patent No.: US 12,176,212 B2
(45) Date of Patent: Dec. 24, 2024

(54) MANDREL STRUCTURES AND METHODS OF FABRICATING THE SAME IN SEMICONDUCTOR DEVICES

(71) Applicant: Taiwan Semiconductor Manufacturing Company, Ltd., Hsin-Chu (TW)

(72) Inventors: Jen-Hong Chang, Hsinchu (TW); Yuan-Ching Peng, Hsinchu (TW); Jiun-Ming Kuo, Hsinchu (TW); Kuo-Yi Chao, Hsinchu (TW); Chih-Chung Chang, Nantou County (TW); You-Ting Lin, Hsinchu (TW); Yen-Po Lin, Taipei (TW); Chen-Hsuan Liao, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 639 days.

(21) Appl. No.: 17/460,488

(22) Filed: Aug. 30, 2021

(65) Prior Publication Data
US 2023/0062305 A1 Mar. 2, 2023

(51) Int. Cl.
*H01L 21/033* (2006.01)
*H01L 21/8234* (2006.01)
*H01L 29/423* (2006.01)
*H01L 29/66* (2006.01)

(52) U.S. Cl.
CPC .. *H01L 21/0337* (2013.01); *H01L 21/823431* (2013.01); *H01L 29/42392* (2013.01); *H01L 29/66795* (2013.01)

(58) Field of Classification Search
CPC ......... H01L 21/823431; H01L 21/0337; H01L 21/3086; H01L 29/66795; H01L 29/785; H01L 29/66439; H01L 29/0673
See application file for complete search history.

(56) References Cited

U.S. PATENT DOCUMENTS 8,067,314 B2 * 11/2011 Davis ................ H01L 21/28132
438/717
2021/0020446 A1 * 1/2021 Sieg .................... H01L 29/0665

* cited by examiner

*Primary Examiner* — Tuan A Hoang
(74) *Attorney, Agent, or Firm* — Haynes and Boone, LLP

(57) ABSTRACT

A method includes forming a semiconductor substrate, forming hard mask layers (HMs) over the semiconductor substrate, forming first mandrels over the HMs, forming second mandrels along sidewalls of the first mandrels, forming a protective layer over the first mandrels and the second mandrels, removing a portion of the protective layer to expose portions of the first and the second mandrels, removing the exposed portions of the second mandrels with respect to the exposed portions of the first mandrels, removing remaining portions of the protective layer to expose remaining portions of the first and second mandrels, where the exposed portions of the first mandrels and the remaining portions of the first and second mandrels form a mandrel structure, patterning the HMs using the mandrel structure as an etching mask, and patterning the semiconductor substrate to form a fin structure using the patterned HMs as an etching mask.

20 Claims, 18 Drawing Sheets

MANDREL STRUCTURES AND METHODS OF FABRICATING THE SAME IN SEMICONDUCTOR DEVICES

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs. For example, patterning semiconductor fins using mandrels of various widths becomes more challenging as device sizes continue to decrease. Although methods for addressing such challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
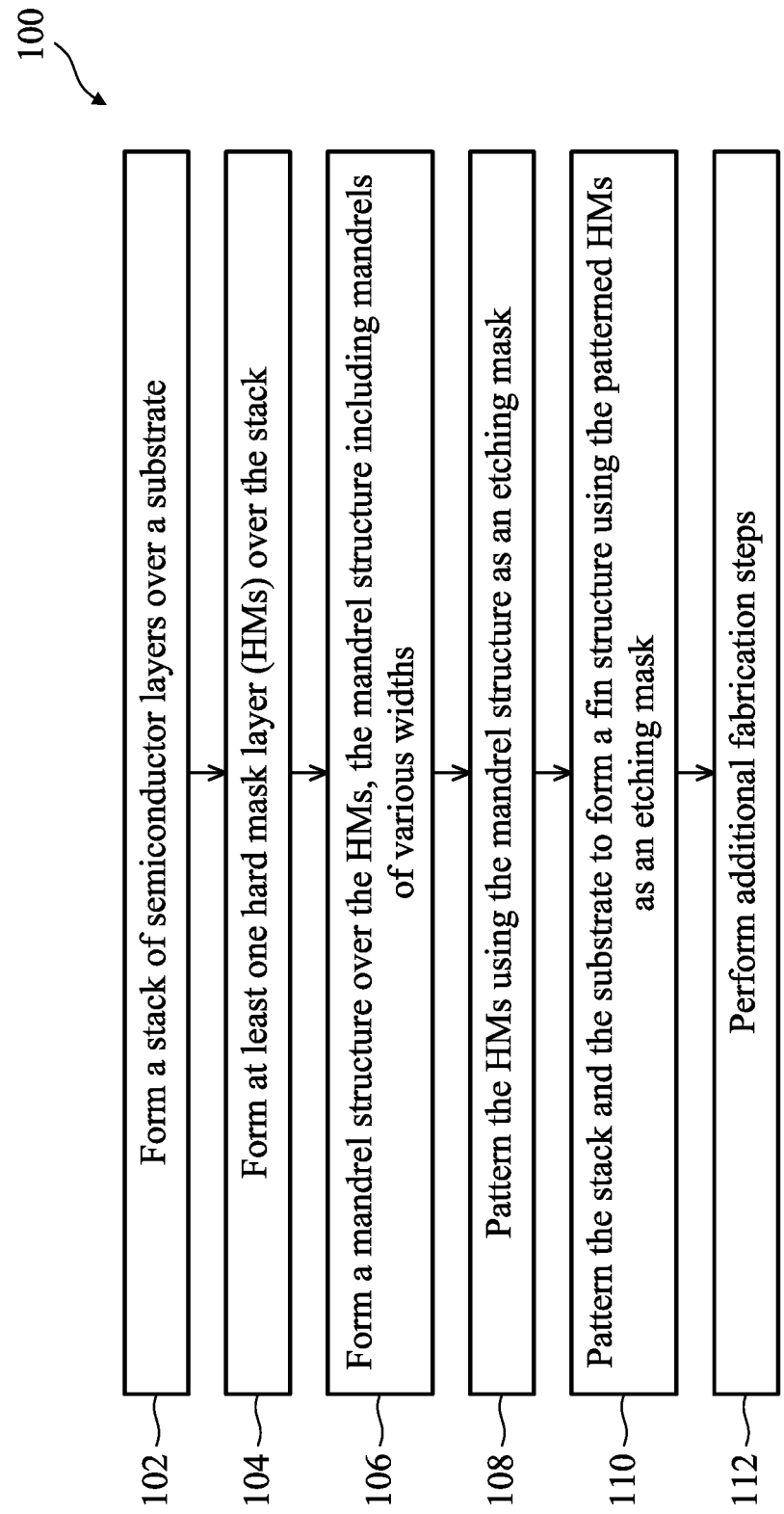
FIG. 1 illustrates a flowchart of an example method for making a semiconductor structure in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nanometers" encompasses the dimension range from 4.5 nanometers to 5.5 nanometers. In addition, the terms "substantially the same," "substantially intact," and the like are intended to include a variation within a reasonable range, such as +/−10%. For example, the term "substantially intact" allows variation ranges within +/−10% of the described features. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to a mandrel structure and a method of forming the same, and more particularly to forming a mandrel structure having mandrels of different widths for fabricating field-effect transistors (FETs), such as nanosheet FETs (NS FETs), fin-like FETs (FinFETs), and/or other FETs. Generally, the mandrel structure is formed by depositing a mandrel material layer over a substrate, followed by patterning and/or etching the mandrel material layer to form mandrels of desired widths, which are then used to pattern three-dimensional active regions (e.g., fin-like structures or fins) of the FETs. While general methods of fabricating mandrels with different widths have been adequate, they have not been entirely satisfactory in all aspects. For example, the etching process may not provide sufficient selectivity to remove the unwanted portions of the mandrel material layer while maintaining the desired dimensions of the resulting mandrels. The resulting mandrels may suffer from non-uniform width and thus alter the widths of the resulting three-dimensional active regions. Therefore, for at least these reasons, improvements in methods of forming the mandrel structure are desired.

Figure 2:
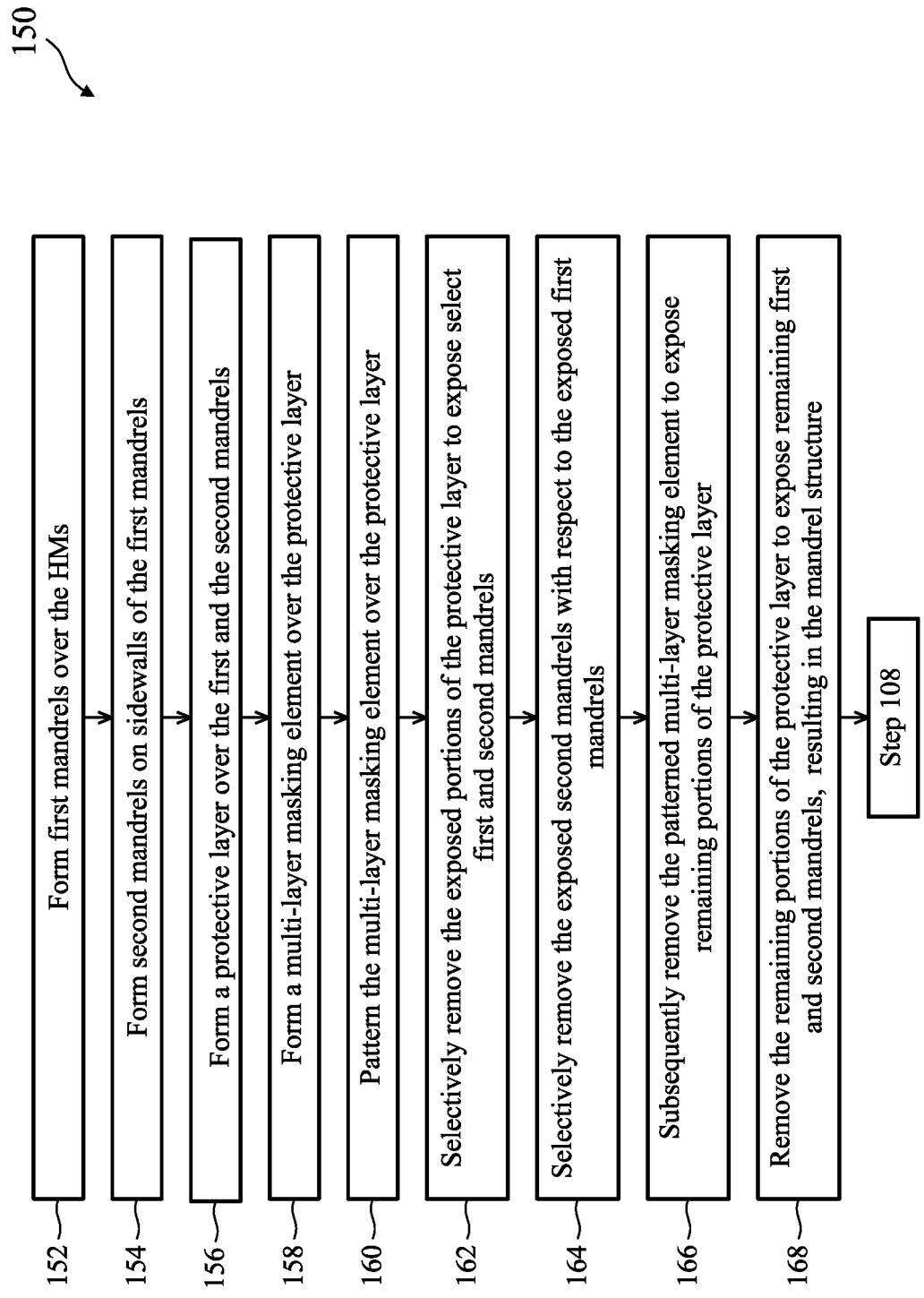
FIG. 2 illustrates a flowchart of an example method for making a mandrel structure in accordance with some embodiments of the present disclosure.

FIGS. 1 and 2 illustrates a flow chart of a method 100 and a flow chart of a method 150, respectively, for forming a fin structure (hereafter referred to as "structure") 200 in accordance with some embodiments of the present disclosure. The methods 100 and 150 are merely examples and are not intended to limit the present disclosure beyond what is explicitly recited in the claims. Additional operations can be performed before, during, and after the methods 100 and/or 150, and some operations described can be replaced, eliminated, or moved around for additional embodiments of the method. Similarly, additional features can be added to the structure 200 and some of the features described below can be replaced, modified, or eliminated in other embodiments of the structure 200. The methods 100 and 150 are described below in conjunction with FIGS. 3-18, which illustrate various views of the structure 200 during intermediate steps of the methods 100 and 150. In particular, FIG. 3 illustrates a three-dimensional view of the structure 200 and FIGS. 3-18 illustrate cross-sectional views of the structure 200 taken along line AA' as shown in FIG. 3 during intermediate stages of the methods 100 and/or 150.

Figure 3:
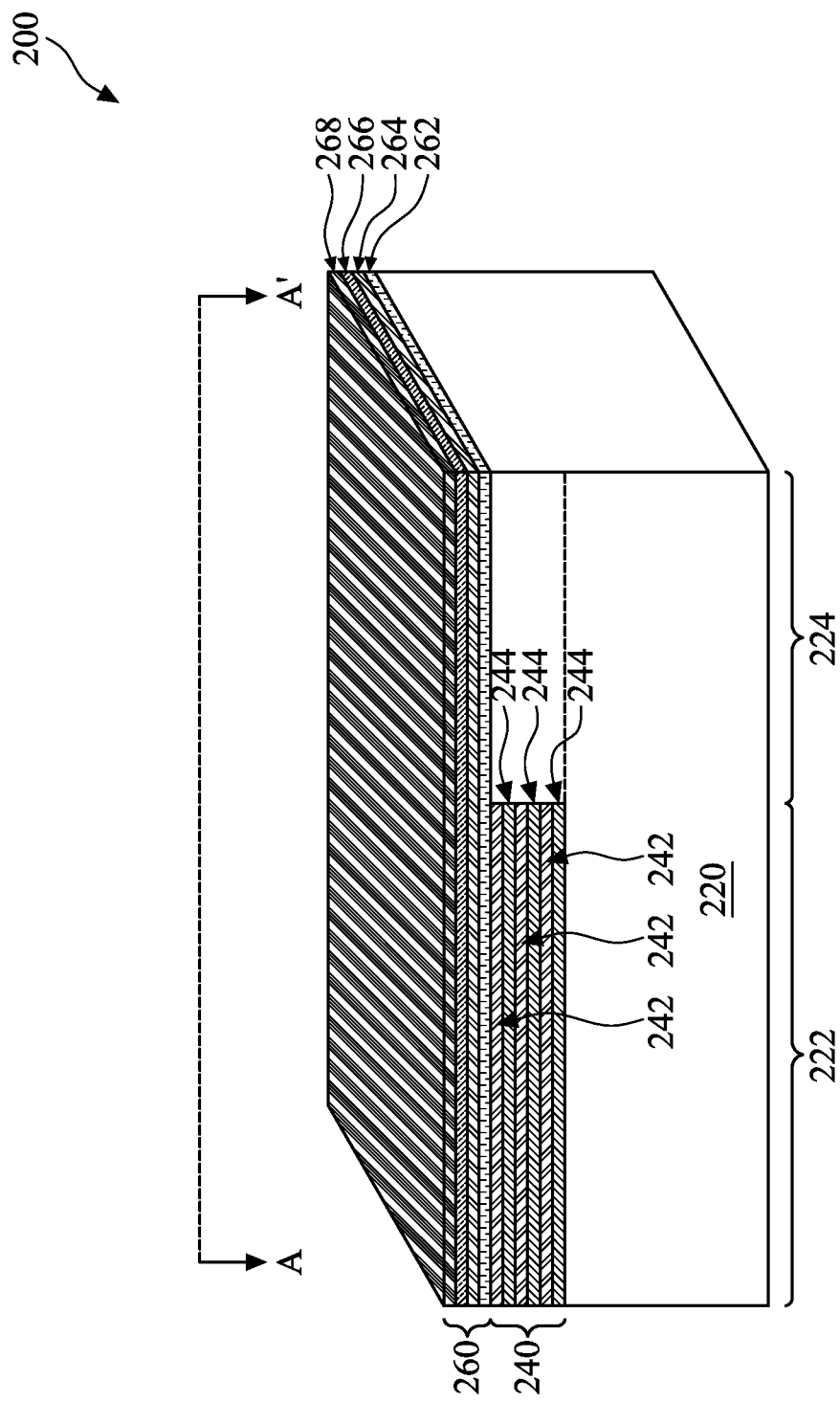
FIG. 3 illustrates a three-dimensional perspective view of an example semiconductor structure during intermediate stages of the example method of FIG. 1 in accordance with some embodiments of the present disclosure.

Referring to FIGS. 1 and 3, the method 100 at operation 102 forms a stack of semiconductor layers 240 over a substrate 220, such that the substrate 220 has a device region 222 including the stack (hereafter referred to as "stack") 240 and a device region 224 adjacent to the device region 222 that is free of the stack 240. The substrate 220 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 220 may be a single-layer material having a uniform composition. Alternatively, the substrate 220 may include multiple material layers having similar or different compositions suitable for IC device manufacturing. In one example, the substrate 220 may be a silicon-on-insulator (SOI) substrate having a silicon layer formed on a silicon oxide layer. In another example, the substrate 220 may include a conductive layer, a semiconductor layer, a dielectric layer, and/or other layers.

In some embodiments where the substrate 220 includes FETs, various doped regions, such as source/drain regions, are disposed in or on the substrate 220. The doped regions may be doped with n-type dopants, such as phosphorus or arsenic, and/or p-type dopants, such as boron or $BF_2$, depending on design requirements. The doped regions may be formed directly on the substrate 220, in a p-well structure, in an n-well structure, in a dual-well structure, or using a raised structure. Doped regions may be formed by implantation of dopant atoms, in-situ doped epitaxial growth, and/or other suitable techniques.

In the present embodiments, the stack 240 includes alternating semiconductor layers 242 and semiconductor layers 244 that are different from the semiconductor layers 242 in composition. In some embodiments, the semiconductor layers 242 and the semiconductor layers 244 may include materials such as silicon, germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, and/or other suitable materials. In some embodiments, the semiconductor layers 242 and the semiconductor layers 244 are substantially dopant-free. In the present embodiments, the semiconductor layers 242 include silicon (Si) but is free of germanium (Ge), and the semiconductor layers 244 include silicon germanium (SiGe). The semiconductor layers 242 may include the same composition as the substrate 220. In some embodiments, the number of pairs of the semiconductor layers 242 and the semiconductor layers 244 in the stack 240 is between two and ten. As an illustrative example, three pairs of the semiconductor layers 242 and the semiconductor layers 244 are included in the stack 240 in the depicted embodiments. In some examples, the semiconductor layers 242 and the semiconductor layers 244 may be formed into nanosheets, nanowires, or nanorods. A sheet (or wire) release process may then be implemented to remove the semiconductor layers 244 to form openings between the semiconductor layers 242.

In some embodiments, still referring to FIG. 3, the stack 240 may be formed by patterning the substrate 220 to form a trench in device region 222 and depositing pairs of the semiconductor layers 242 and semiconductor layers 244 in the trench. Alternatively, the device region 222 may be formed by depositing pairs of the semiconductor layers 242 and semiconductor layers 244 on the substrate 220 and subsequently patterning the layers to form the stack 240 in the device region 222. Consequently, a portion of the substrate 220 disposed adjacent to the stack 240 is defined as the device region 224. Other suitable techniques may also be implemented to form the stack 240 in addition to, or in combination of, the aforementioned methods. The depositing of the pairs of the semiconductor layers 242 and semiconductor layers 244 may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, and/or other suitable selective epitaxial growth (SEG) processes. The epitaxy process may use gaseous and/or liquid precursors containing a suitable material (e.g., Ge for the semiconductor layers 244), which interact with the composition of the underlying substrate, e.g., the substrate 220. The patterning process may include forming a masking element that includes a photoresist layer (resist), exposing the resist to a photomask, performing a post-exposure baking process, and developing the exposed resist to form a patterned masking element. The patterned masking element is then used as an etching mask to etch the substrate 220 an/or the stack 240 using a wet etch, a dry etch, a reactive ion etch (RIE), and/or any suitable etching process.

Still referring to FIGS. 1 and 3, the method 100 proceeds to step 104 by forming a stack of hard mask layers (HMs) 260 over the structure 200. The HMs 260 may include multiple layers of different dielectric materials such as, for example, silicon oxide (SiO and/or $SiO_2$), silicon nitride (SiN), silicon carbide (SiC), oxygen-containing silicon nitride (SiON), oxygen-containing silicon carbide (SiOC), carbon-containing silicon nitride (SiCN), and/or other suitable materials. Various layers of the HMs 260 may be deposited by a suitable technique, such as CVD, physical vapor deposition (PVD), atomic layer deposition (ALD), spin-on coating, and/or other suitable technique.

In the present embodiments, the HMs 260 includes multiple layers of dielectric materials. For example, the HMs 260 may include a first oxide layer 262 over the stack 240, a nitride layer 264 over the first oxide layer 262, a second oxide layer 266 over the nitride layer 264, and a third oxide layer 268 over the second oxide layer 266. In some embodiments, the first oxide layer 262, the second oxide layer 266 and the third oxide layer 268 each include silicon oxide, and the nitride layer 264 include silicon nitride.

In some embodiments, the multiple layers of the HMs 260 are formed by different deposition methods to obtain layers of different thicknesses and/or morphologies. For example, the second oxide layer 266 may be formed by CVD to a thickness of about 450 Å and the third oxide layer 268 may be formed by ALD to a thickness of about 100 Å for purposes of reducing tensile stress therebetween and for providing a more uniform topography for the HMs 260.

Figure 4:
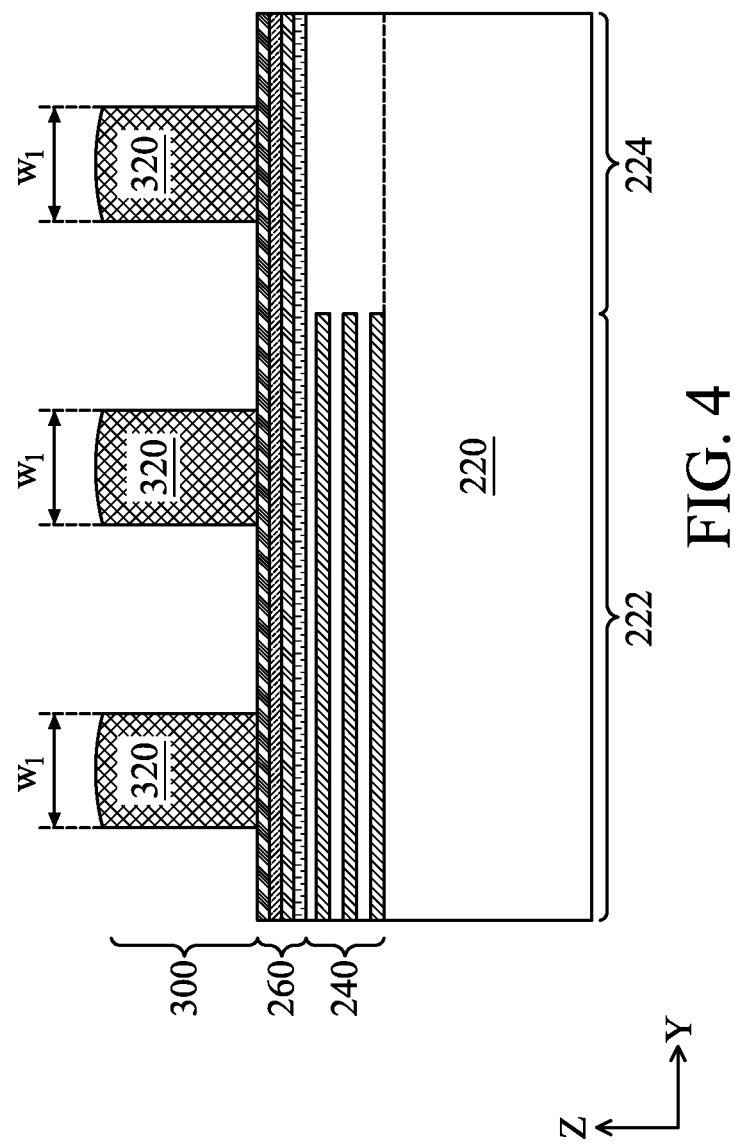
FIGS. 4, 5, 6, 7, 8, 9, 10, 11, 12, 13, 14, 15, 16, 17 and 18 illustrate cross-sectional views of the example semiconductor structure of FIG. 3 taken along line AA' at intermediate stages of the methods of FIGS. 1 and 2 in accordance with some embodiments of the present disclosure.

Referring to FIGS. 1, 2 and 4, the method 100 proceeds to step 106 by forming a mandrel structure 300. The formation of the mandrel structure 300 is further illustrated in detail by method 150 in FIG. 2, starting with step 152 by forming first mandrels 320 over the HMs 260. In some embodiments, the first mandrels 320 are formed by depositing a mandrel material layer (not shown) over the stack of HMs 260 and subsequently patterning the mandrel material layer to form the first mandrels 320. In the present embodiments, the first mandrel material layer includes amorphous silicon or polysilicon. The first mandrel material layer may be deposited by various methods, including CVD, ALD, PVD, and/or other suitable methods, and patterned via a series of photolithography and etching processes, which may be similar to the series of patterning and etching processes discussed in detail above with respect to forming the device regions 222 and 224. In the present embodiments, the first mandrels 320 are formed to a width $w_1$, which may be used to pattern one or more fins in the device region 222 and/or the device region 224 during subsequent processing steps. In this regard, the width $w_1$ may be any suitable values according to specific design requirements for the subsequently-formed fins.

Figure 5:
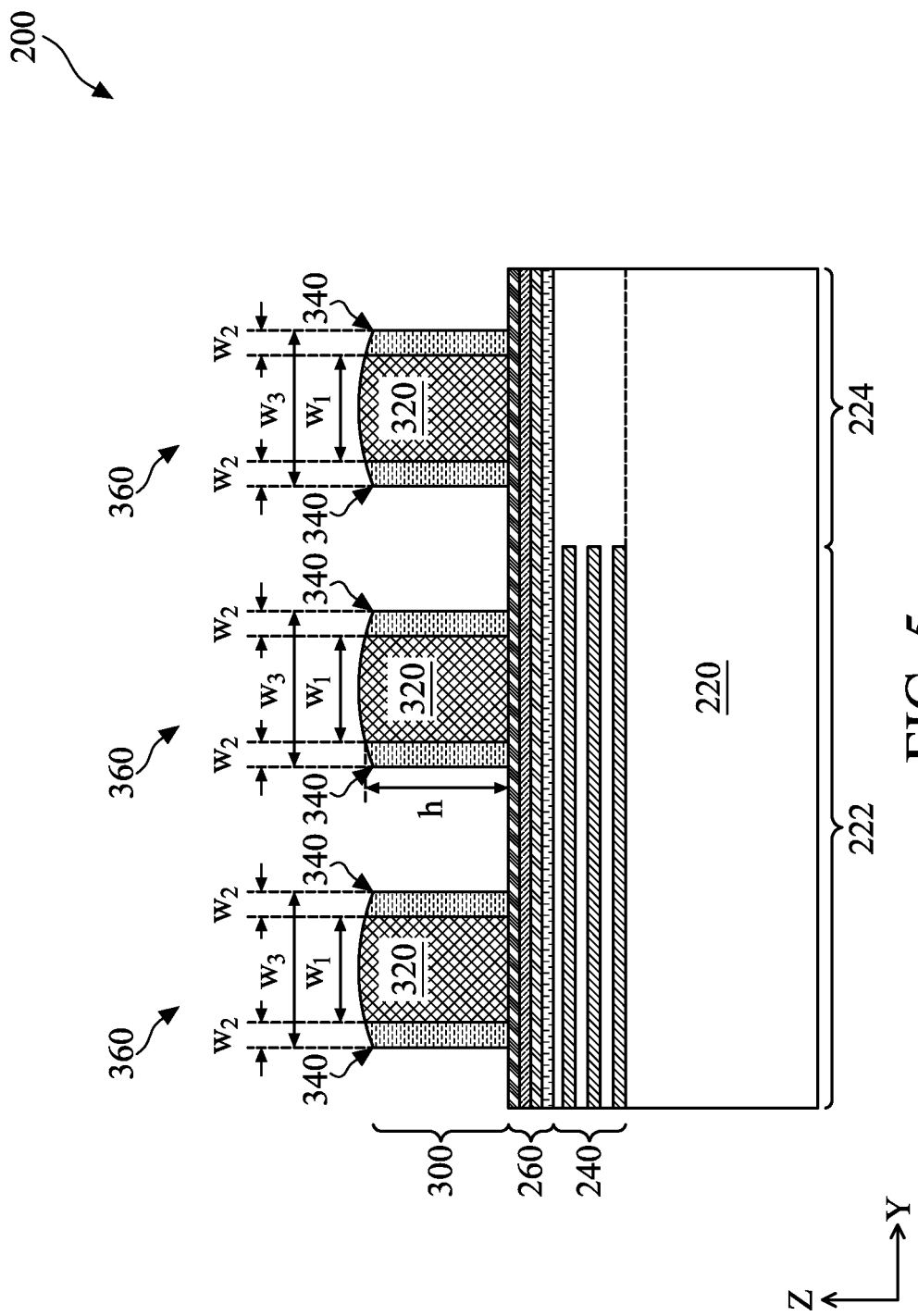

Referring to FIGS. 2 and 5, the method 150 proceeds to step 154 by forming second mandrels 340 along sidewalls of the first mandrels 320. For purposes of clarity, the present disclosure hereafter collectively refers to a first mandrel 320 and two second mandrels 340 formed on its sidewalls as a composite mandrel 360. In the present embodiments, the second mandrels 340 include a material different from that of the first mandrels 320 to achieve etching selectivity in subsequent etching process. The second mandrels 340 may be formed by depositing a second mandrel material layer (not shown) over the first mandrels 320 as a blanket layer and subsequently performing an anisotropic etch to remove portions of the second mandrel material layer, leaving the second mandrels 340 on the sidewalls of the first mandrels 320. The second mandrel material layer may include SiN, silicon oxide, SiCN, SiOC, SiON, SiOCN, and/or other suitable dielectric material. In the present embodiments, the second mandrel material layer includes SiN and the first mandrel material is free of nitrogen (e.g., in the form of SiN). The second mandrel material layer may be deposited by CVD, ALD, PVD, and/or other suitable techniques. In some embodiments, the second mandrel material layer is formed to a second width $w_2$, which may be used to pattern one or more fins in the device region 224 and/or the device region 222 during subsequent processing steps. In some embodiments, the width $w_2$ is adjusted based on a thickness of the second mandrel material layer formed during the deposition process. The width $w_2$ may be any suitable values according to specific design requirements for the subsequently-formed fins. In the present embodiments, the width $w_2$ is less than the width $w_1$. Accordingly, a composite mandrel 360 that includes the first mandrel 320 and a pair of second mandrels 340 is defined by a width $w_3$ that is a sum of the width $w_1$ and twice the width $w_2$.

In some embodiments, the anisotropic etch at step 154 may inadvertently remove edge portions of the first mandrels 320 and/or the second mandrels 340, causing a top surface of each composite mandrel 360 to be curved downward, i.e., a center portion of each composite mandrel 360 being higher than the edge portions thereof. Thus, for purposes of simplicity and clarity, each composite mandrel 360 is defined by a height h that is measured through its center portion as illustrated in FIG. 5.

Figure 6:
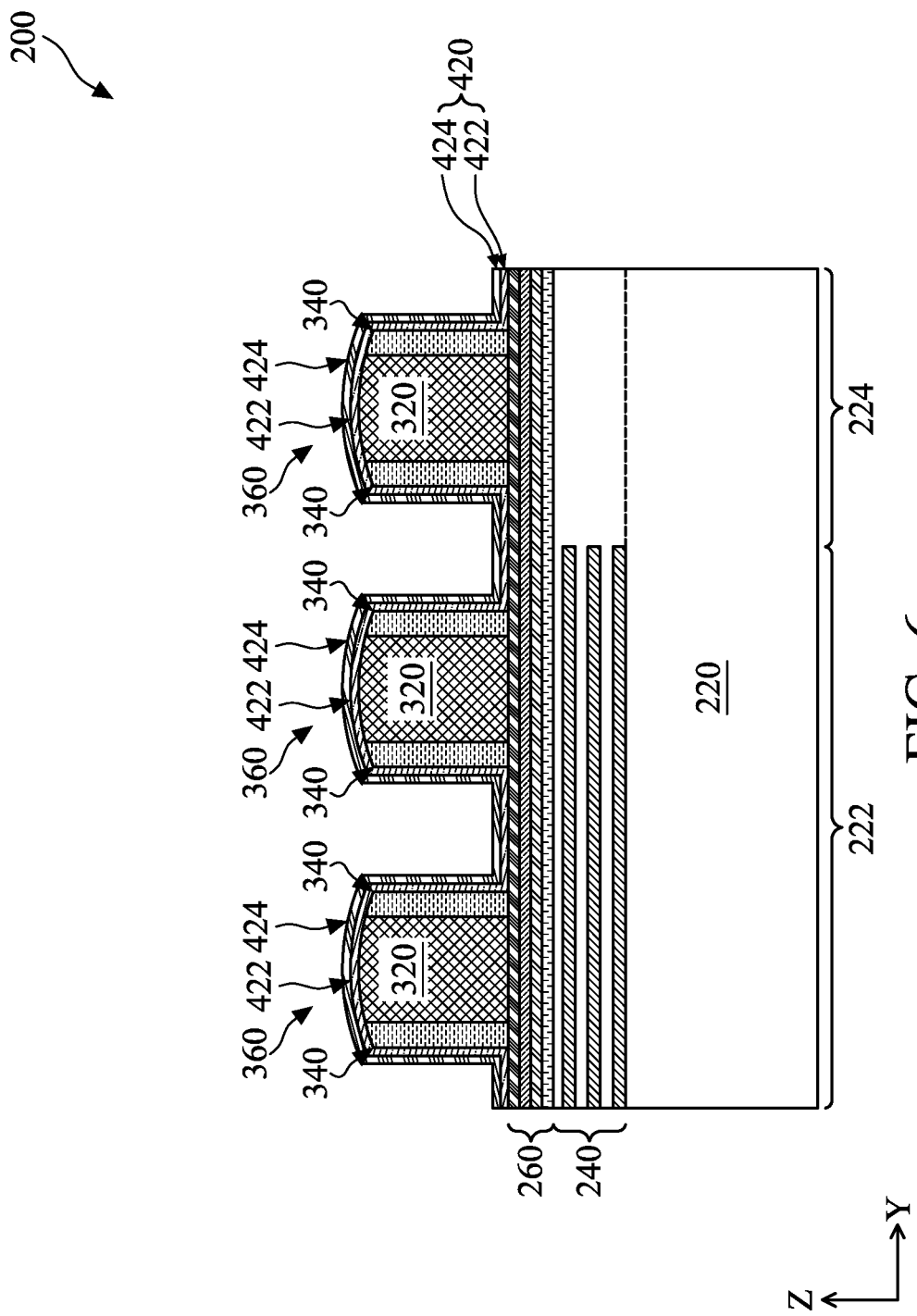

Referring to FIGS. 2 and 6, the method 150 proceeds to step 156 by forming a protective layer 420 over the substrate 220 and the composite mandrels 360 disposed thereon. In the present embodiments, the protective layer 420 is configured to protect the composite mandrels 360 from etchants used during the subsequent etching processes, thus maintaining the desired dimensions of the composite mandrels 360. For example, in order to selectively remove portions of the second mandrels 340 with respect to the first mandrels 320, the etchant used in the corresponding etching process may seep through a masking element designed to protect the composite mandrels 360 not to be etched, thereby inadvertently damaging these composite mandrels 360. By forming the protective layer 420 over the composite mandrels 360, the penetration of the etchant is effectively blocked such that the underlying composite mandrels 360 remain substantially intact during the etching process. In some examples, a thickness of the protective layer 420 may be about 1.8 nanometers to about 4.2 nanometers; of course, other dimensions may also be applicable in the present disclosure.

In some embodiments, the protective layer 420 includes multiple layers with different compositions. In the present embodiments, the protective layer 420 includes a coating layer 424 disposed over a dielectric layer 422. In some embodiments, the dielectric layer 422 includes silicon oxide and/or silicon carbonitride. In some embodiments, the dielectric layer 422 includes a material different from that of the HMs 260 to provide etching selectivity during sequent etching processes. The dielectric layer 422 may be deposited by CVD, ALD, PVD, and/or any other suitable techniques. In some embodiments, the dielectric layer 422 is deposited by CVD. In the present embodiments, the coating layer 424 includes carbon (i.e., is a carbon coating) and is configured with a greater density than the dielectric layer 422 to provide protection (in addition to that offered by the dielectric layer 422) for the underlying composite mandrels 360 against the etchant utilized in subsequent processes, i.e., the etching process 610 (explained in detail below). The coating layer 424 may be deposited by ALD, CVD, PVD, and/or any other suitable techniques. In some embodiments, ALD is utilized to deposit the coating layer 424 over the dielectric layer 422.

In some embodiments, the thickness of the dielectric layer 422 is greater than the coating layer 424. In the present embodiments, the ratio of the thicknesses of the dielectric layer 422 to the coating layer 424 is about 2 to about 12. In some embodiments, the thickness of the dielectric layer 422 is about 1.5 nanometers to about 3.5 nanometers and the thickness of the coating layer 422 is about 0.3 nanometers to about 0.7 nanometers. In some examples, the thickness of the dielectric layer 422 may be about 2.5 nanometers and the thickness of the coating layer 424 may be about 0.5 nanometers. The thicknesses of the dielectric layer 422 and the coating layer 424 are not limited to such dimensions in the present disclosure, so long as they are suitable for providing protection for the underlying composite mandrels 360 against the subsequent etching process.

Figure 7:
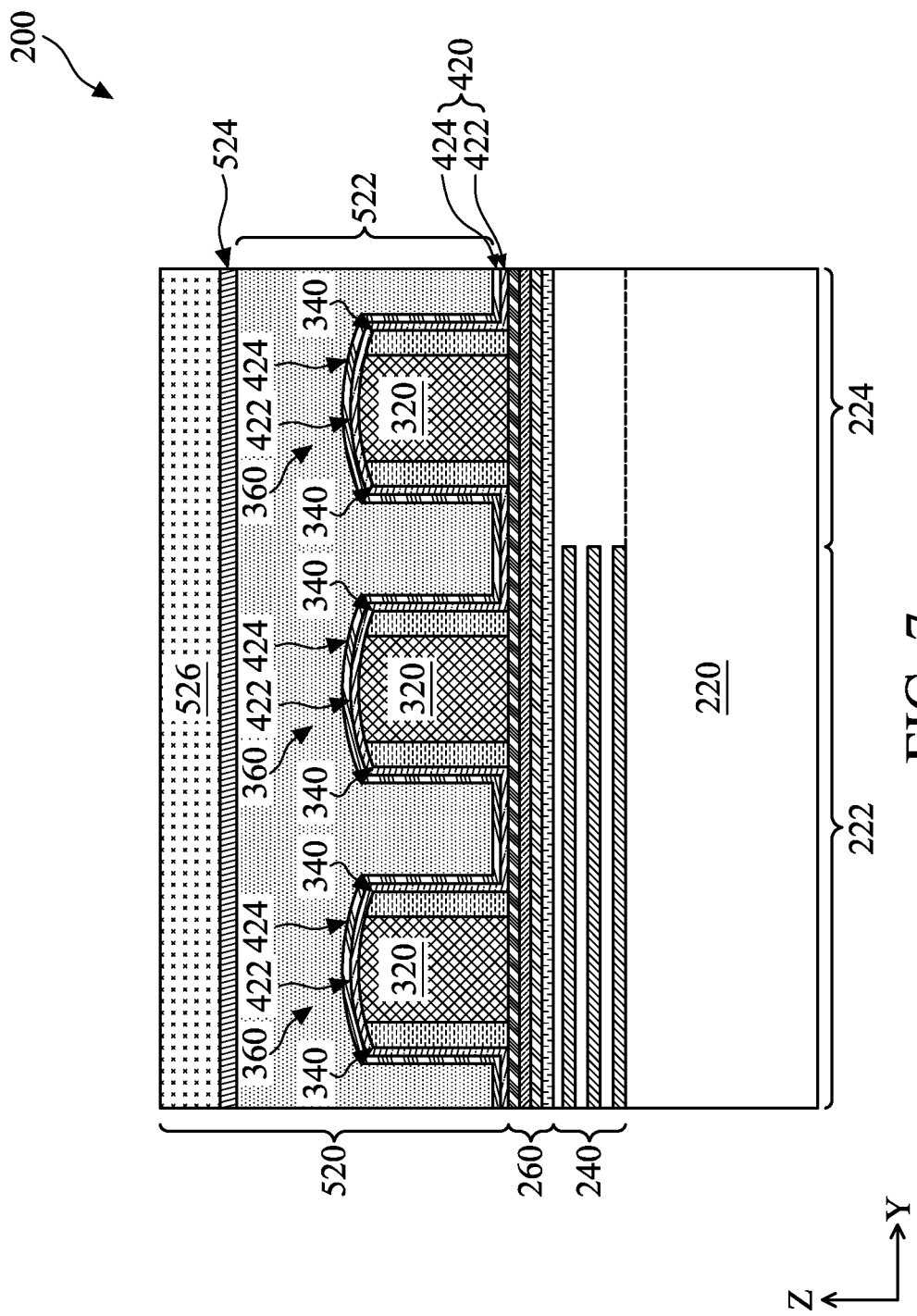

Referring to FIGS. 2 and 7, the method 150 proceeds to step 158 by forming a multi-layer masking element 520 over the protective layer 420. In the present embodiments, the multi-layer masking element 520 is a tri-layer masking element that includes a bottom reflective coating (BARC) 522, an HM 524 over the BARC 522, and a photosensitive layer 526 over the HM 524. In the present embodiments, the BARC 522 is a carbon-containing organic material, including benzene and/or hydroxyl groups. In the present embodiments, as will be discussed in detail below, increasing the concentration of benzene to at least about 30% improves the resistance of the BARC 522 against the etchant utilized to selectively remove the second mandrels 340. Similarly, increasing the concentration of hydroxyl groups to at least about 10% may increase the adhesion of the BARC 522 to the protective layer 420 thereunder. In some embodiments, the HM 524 may be a single-layer structure or may include multiple layers each having a different composition. In some embodiments, the HM 524 may be a polymer layer formed by spin-coating a solution comprising a suitable polymer dissolved in a solvent for forming the HM 524 over the BARC 522. In the present embodiments, the photosensitive layer 526 includes photosensitive materials that causes the layer to undergo a property change when exposed to light, such as ultraviolet (UV) light, deep UV (DUV) light, and/or extreme UV (EUV) light.

Figure 8:
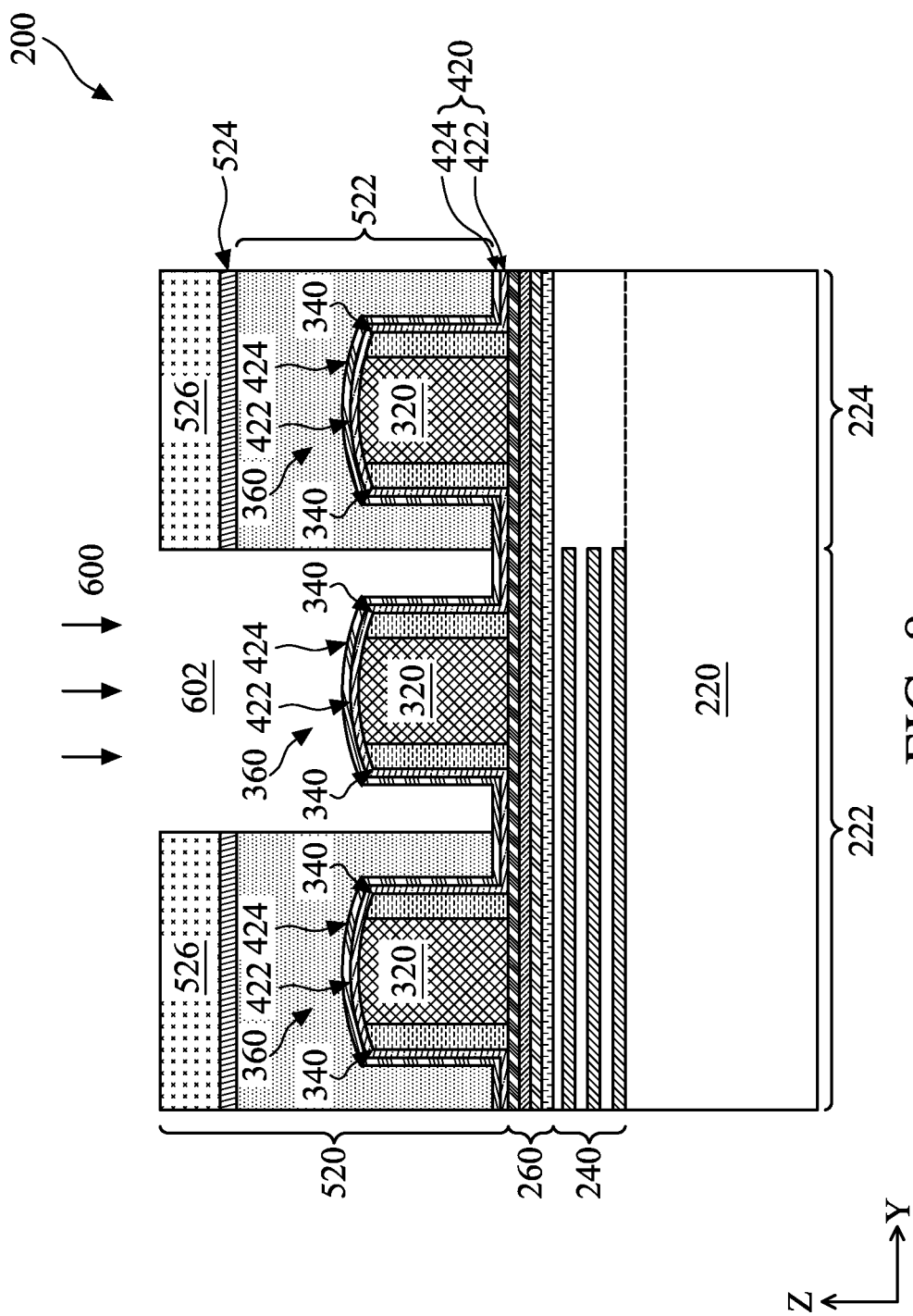

Referring to FIGS. 2 and 8, the method 150 proceeds to step 160 by patterning the multi-layer masking element 520 in a patterning process 600 to expose a portion of the protective layer 420 in an opening 602. In the present embodiments, the opening 602 includes one or more composite mandrels 360, at least a portion of which is subsequently removed, while a remainder of the composite mandrels 360 remain under the multi-layer masking element 520. In the depicted embodiments, the opening 602 includes one composite mandrel 360 having one first mandrel 320 and two second mandrels 340, where the second mandrels 340 are subsequently removed as discussed in detail below. In the depicted embodiments, the patterning process 600 removes a portion of the multi-layer masking element 520 to expose an entirety of a composite mandrel 360 in the device region 222 of the substrate 220. In some embodiments, though not depicted herein, the patterning process 600 removes a portion of the multi-layer masking element 520 such that the opening 602 exposes an entirety of a composite mandrel 360 in the device region 222 and a portion of a composite mandrel 360 in the device region 224. In other words, one of the two second mandrels 340 (but not the other one of the second mandrels 340 or the first mandrel 320 on which they are disposed) in the device region 224 may be selectively exposed in the opening 602 and subsequently removed as discussed in detail below. In some embodiments, the patterning process 600 is similar to that discussed above with respect to the forming of the first mandrels 320 at step 152 and includes exposing the photosensitive layer 526 to a photomask, performing a post-exposure baking process, developing the exposed photosensitive layer 526, and subsequently etching the HM 524 and the BARC 522 using the patterned photosensitive layer 526 as an etching mask. The patterned multi-layer masking element 520 is used as an etching mask for the following etching processes.

Figure 9:
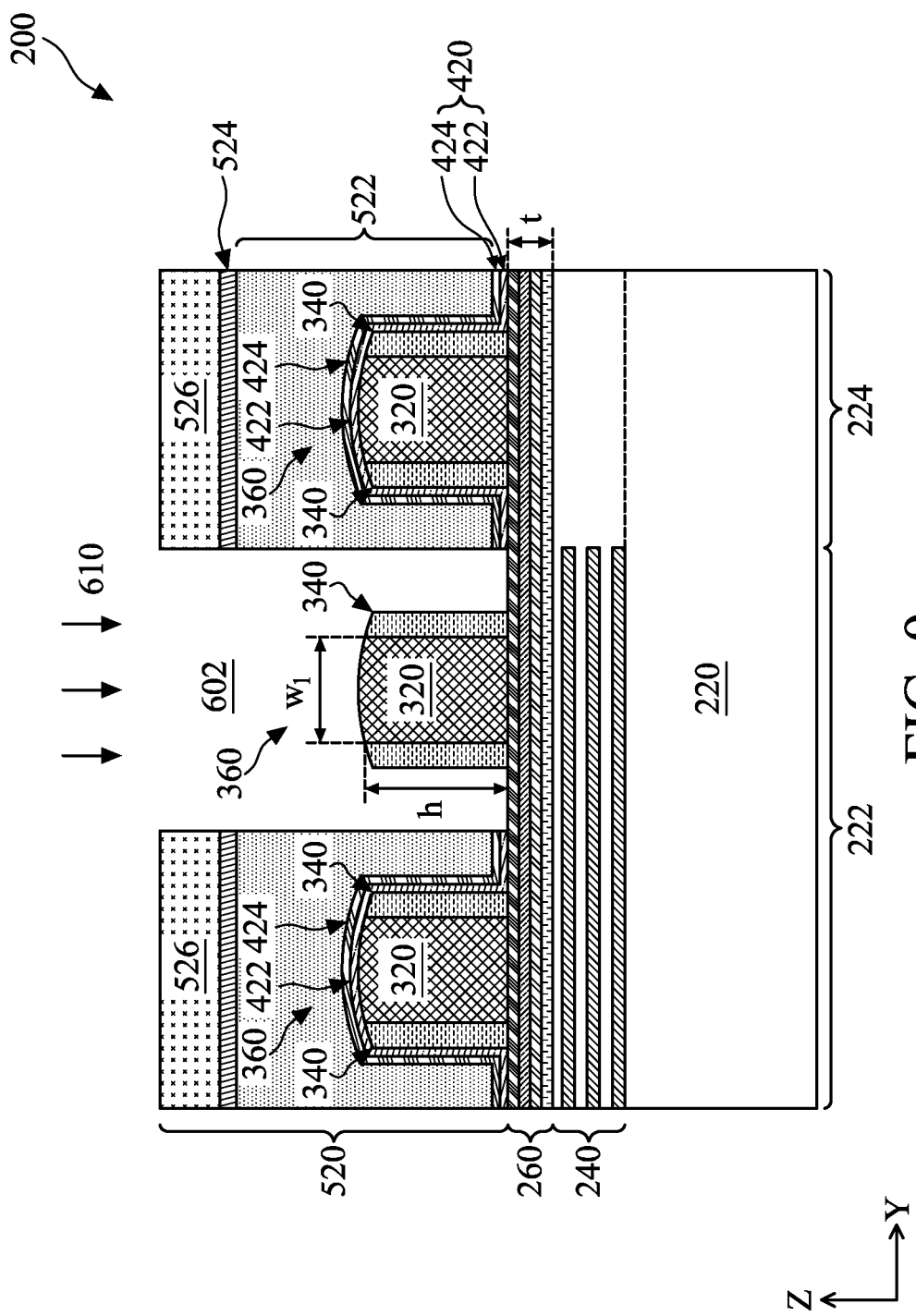

Referring to FIGS. 2 and 9, the method 150 proceeds to step 162 by selectively removing the exposed portion of the protective layer 420 via an etching process 610. In the depicted embodiments, the etching process 610 selectively removes the exposed portion of the protective layer 420 without removing, or substantially removing, the exposed first mandrel 320 and the second mandrels 340 thereunder. In some embodiments, the etching process 610 may inadvertently remove a small portion of the HMs 260 while removing the exposed portion of the protective layer 420; however, such loss of the HMs 260 is does not significantly affect the subsequent processes. The etching process 610 may include a dry etch, a wet etch, an RIE, and/or other suitable etching methods. In the present embodiments, the etching process 610 is a wet etching process that utilizes an etchant including hydrofluoric acid.

In the present embodiments, in order to minimize inadvertent damage to the patterned multi-layer masking element 520 (and the underlying components), the etching process 610 is controlled by adjusting the concentration of the hydrofluoric acid. In some examples, the concentration of the hydrofluoric acid may be about 0.2%. It is noted that a concentration higher than about 0.2% may damage the patterned multi-layer masking element 520 and the underneath protective layer 420, thereby rendering the first mandrels 320 and the second mandrels 340 disposed thereunder vulnerable to the hydrofluoric acid, and a concentration lower than about 0.2% may not be effective to remove the exposed protective layer 420. In some examples, the etching process 610 may be implemented at a temperature of about 23° C. and for a duration of about 265 seconds; of course, other etching parameters may also applicable to the present embodiments.

In some embodiments, hydrofluoric acid may seep through the multi-layer masking element 520 and thus etch the underlying un-exposed portion of the dielectric layer 422, the coating layer 424 and the composite mandrels 360. The coating layer 424, in this case, provides protection for the underlying composite mandrels 360 against hydrofluoric acid in addition to the protection provided by the dielectric layer 422. Assuming the thickness of the coating layer 244 is held constant, if the ratio of the thickness of the dielectric layer 422 to the thickness of the coating layer 424 is too high, i.e., the dielectric layer 422 is too thick, the exposed portion of the dielectric layer 422 intended to be removed during the etching process 610 might not be completely removed. On the other hand, if the ratio is too low, i.e., the dielectric layer 422 is too thin, the un-exposed portion of the dielectric layer 422 may not provide sufficient protection over the underlying composite mandrels 360 against hydrofluoric acid seeped through the multi-layer masking element 520.

Figure 10:
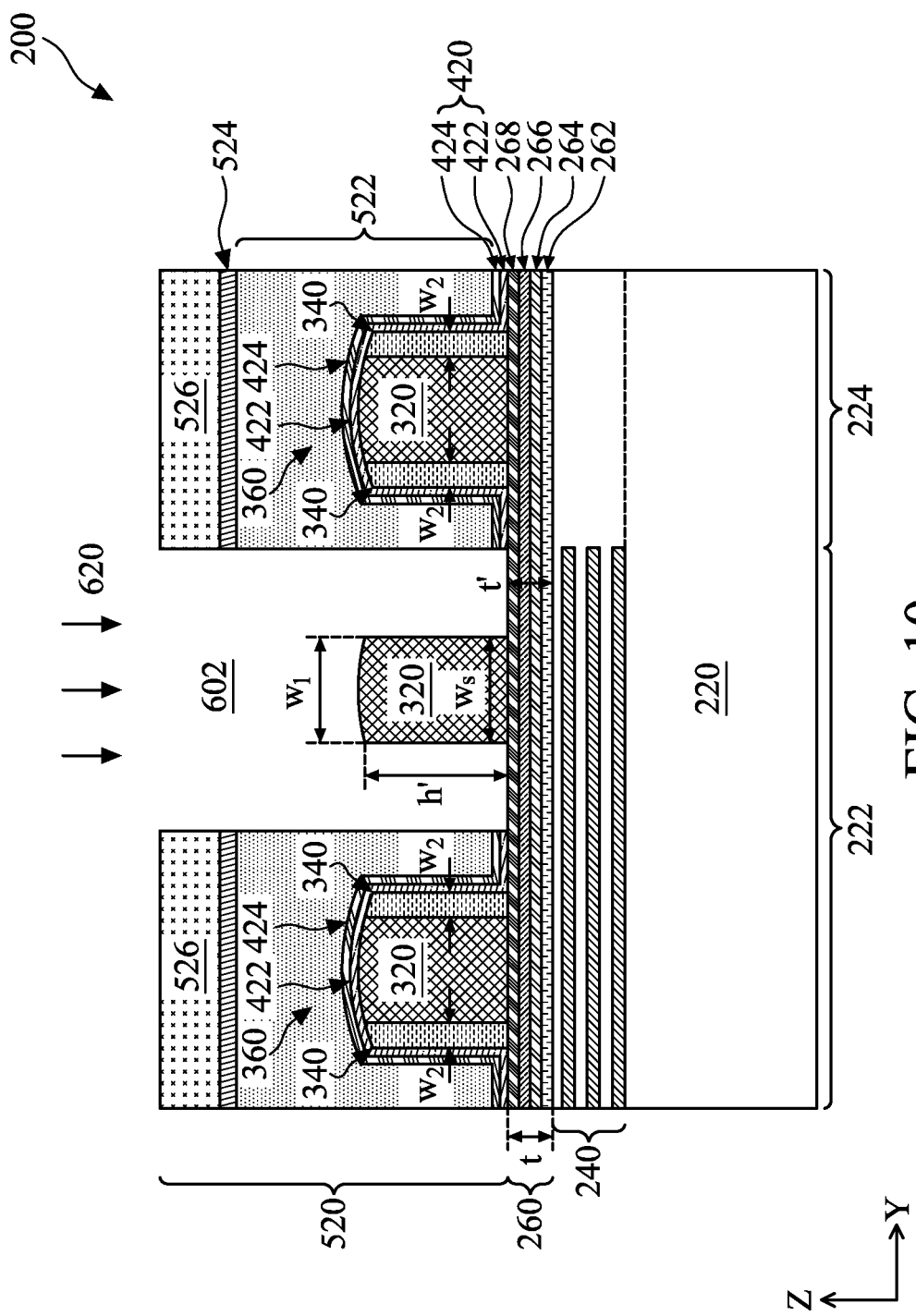

Referring to FIGS. 2 and 10, the method 150 proceeds to step 164 by selectively removing the second mandrels 340 with respect to the first mandrel 320 exposed in the opening 602 in an etching process 620. In this regard, the etching process 620 is different from the etching process 610 discussed above with respect to the step 162 as they selectively remove different material layers. For embodiments in which the opening 602 selectively exposes only one of the second mandrels 340 in the device region 224, the etching process 620 at step 164 additionally removes such selectively exposed second mandrel 340 in addition to the exposed second mandrels 340 in the device region 222. In the present embodiments, the etching process 620 is a wet etching process that utilizes an etchant including phosphoric acid. In some examples, the etching process 620 may be implemented at a temperature of about 160° C. and for a duration of about 90 seconds; of course, other etching parameters may also applicable to the present embodiments. After implementing step 164, the first mandrel 320 exposed in the opening 602 is referred as a stand-alone first mandrel 320 hereafter.

In the present embodiments, still referring to FIG. 10, phosphoric acid is chosen as an etchant for the etching process 620 at step 164 to provide etching selectivity between the second mandrels 340 and the first mandrel 320 exposed in the opening 602. In some currently implemented methods, the etching processes (e.g., dry etch) utilized to selectively remove the second mandrels 340 may lack sufficient selectivity toward SiN, such that the resulting stand-alone first mandrel 320 has a width $w_s$ at its bottom portion that is less than the width $w_1$ at its top portion, i.e., forming bottom notches in the stand-alone first mandrel 320. In the present embodiments, phosphoric acid is configured to provide greater etching selectivity toward the exposed second mandrels 340, thereby enabling the resulting stand-alone first mandrel 320 to have substantially the same width along its height without the bottom notches, e.g., the width $w_s$ at its bottom portion is substantially the same as the width $w_1$ at its top portion. In some examples, a difference between the width $w_1$ and the width $w_s$, defined as $(w_1-w_s)/w_1$, may be less than about 5.5%.

The substantial uniformity in width of the stand-alone first mandrel 320 may thus improve critical dimension (CD) of the subsequently-formed fins in the stack 240 and/or the substrate 220. In this regard, the width $w_1$ is hereafter used to represent the width of the stand-alone first mandrel 320 for purposes of simplicity and clarity. Additionally, the enhanced selectivity of phosphoric acid as an etchant may also reduce any height loss of the exposed first mandrels 320 during the etching process 620 for improved uniformity in mandrel dimensions. Further, due to the enhanced etching selectivity, phosphoric acid as an etchant may also reduce the loss of HMs 260 during the etching process 620 compared to other alternative processes.

In the present embodiments, the first mandrels 320 are each defined by the height h before implementing the etching process 620 (as shown in FIG. 9) and by a height h' after implementing the etching process 620 (as shown in FIG. 10). Although the etching process 620 may result in loss of the height h, such loss is reduced by the improved etching selectivity during etching process 620 toward the SiN-containing second mandrels 340 compared to other alternative processes, e.g., dry etching process. In some examples, loss in the height h, defined as (h–h')/h, may be less than about 13%.

In the present embodiments, the thickness of the HMs 260 (including the first oxide layer 262, the nitride layer 264, the second oxide layer 266, and the third oxide layer 268) is defined by a thickness t before implementing the etching process 620 as depicted in FIG. 9. After implementing the etching process 620, as depicted in FIG. 10, portions of the HMs 260 exposed in the opening 602 may be defined by a thickness t' and remaining portions of the HMs 260 under the multi-layer masking element 520 maintain the thickness t. In the present embodiments, t' is substantially the same as t due to the improved selectivity of the etching process 620 at step 164 against the second mandrels 340. In some examples, a difference between the thickness t and the thickness t', defined as (t–t')/t, may be no more than about 10%.

While phosphoric acid is effective at removing the exposed second mandrels 340, it may cause potential damage to other components of the structure 200 surrounding the exposed second mandrels 340, such as the multi-layer masking element 520 and the underlying composite mandrels 360. In the present embodiments, the aforementioned protective layer 420 as well as the specifically designed BARC compositions provide additional protection against such potential damage to the composite mandrels 360 not intended to be etched.

Figure 11:
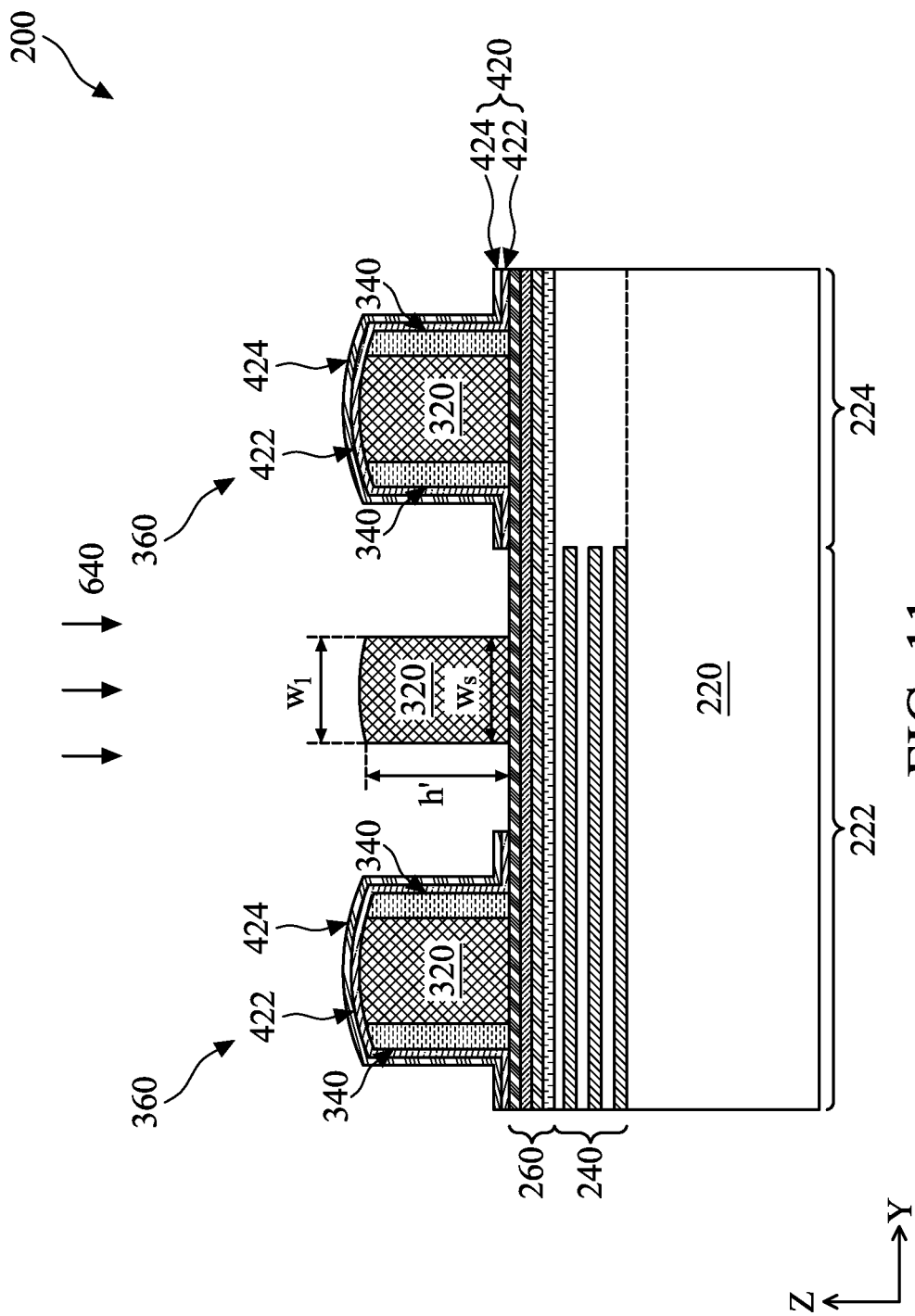

Referring to FIGS. 2 and 11, the method 150 proceeds to step 166 by removing the patterned multi-layer masking element 520 in a process 630 to expose remaining portions of the protective layer 420. The process 630 may implement resist stripping, plasma ashing, and/or other suitable processes.

Figure 12:
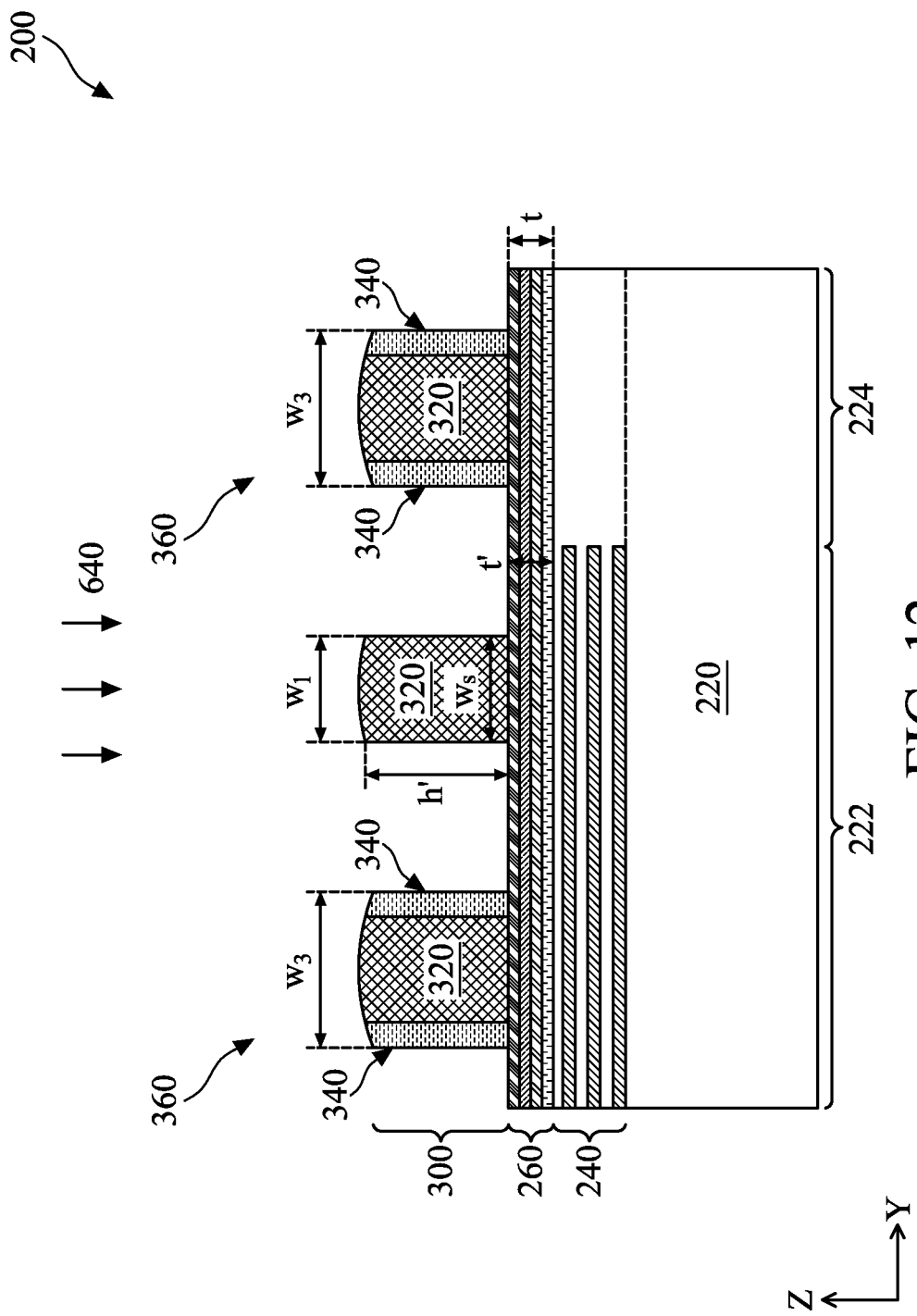

Referring to FIGS. 2 and 12, the method 150 proceeds to step 168 by removing the remaining portions of the protective layer 420 in an etching process 640 to expose the remaining composite mandrels 360. In some embodiments, the etching process 640 includes, for example, a dry etch, a wet etch, RIE, and/or other suitable etching processes. In the present embodiments, the etching process 640 is a wet etch utilizing hydrofluoric acid as an etchant. The etching process 640 may be similar to the etching process 610 discussed above with respect to step 162 and FIG. 9, with the exception that the etching process 640 may utilizes different processing parameters (e.g., etchant concentration, etching time, and duration). For example, in order to protect the second mandrels protected under the multi-layer masking element 520, the concentration of hydrofluoric acid may need to be adjusted for the etching process 610 but not for the etching process 640. It is noted that, similar to the etching process 610, the etching process 640 may inadvertently remove a portion of the HMs 260; however, such loss of the HMs 260 does not significantly affect the subsequent processes or the resulting structure. In some embodiments, referring to FIGS. 1 and 2, the formation of the mandrel structure 300 is complete and the method 150 subsequently proceeds to step 108 of the method 100 to further process the mandrel structure 300.

In some embodiments, the method 150 at step 168 further includes forming stand-alone second mandrels 340 by removing selective first mandrels 320 from the remaining composite mandrels 360, such that the resulting mandrel structure 300 includes multiple mandrels having at least three different widths, e.g., $w_1$, $w_2$, and $w_3$. Thereafter, the method 150 proceeds to step 108 as discussed above. Embodiments of forming the stand-alone second mandrels 340 are discussed in detail below in reference to FIGS. 13-16.

Figure 13:
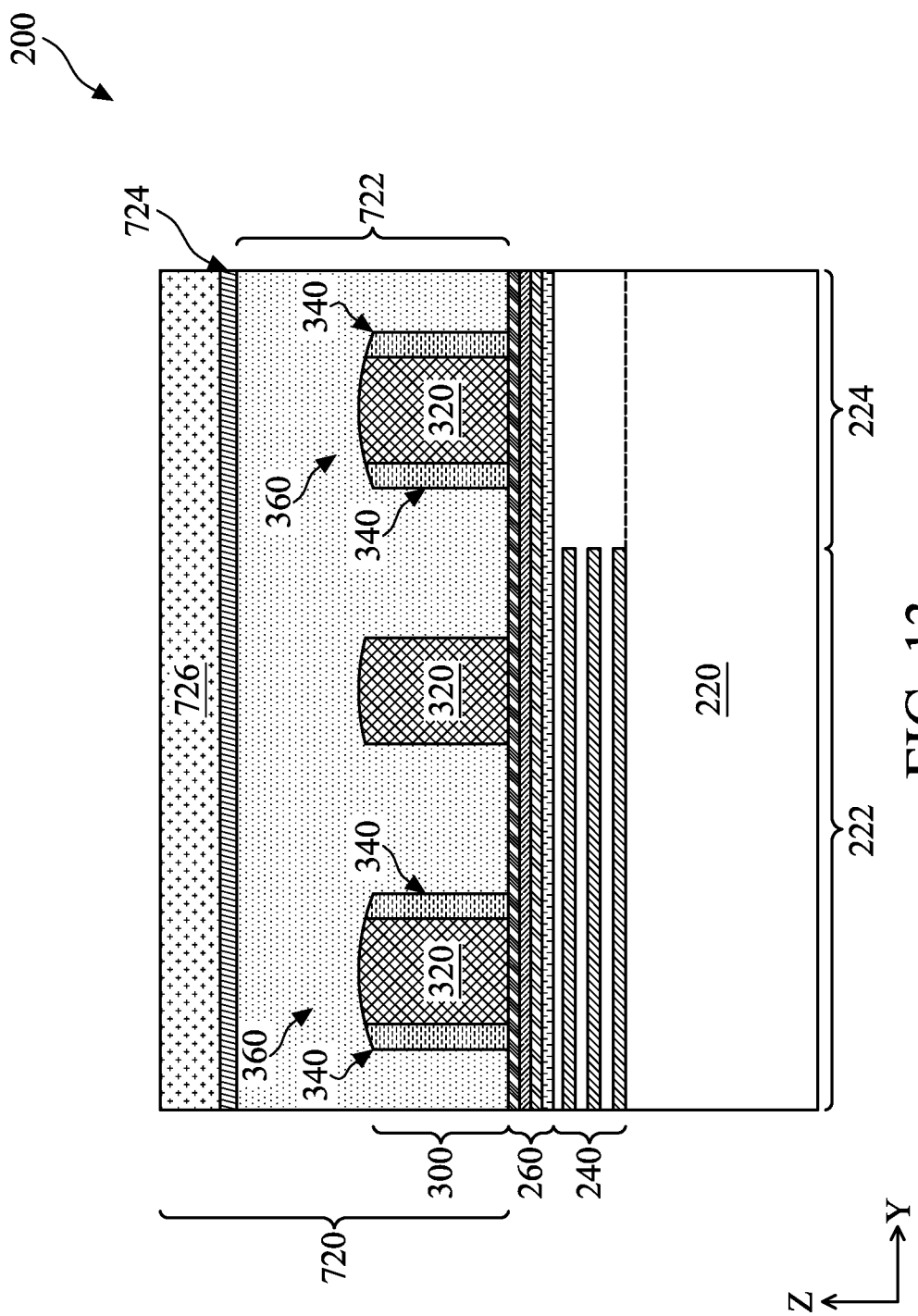

Now referring to FIG. 13, a multi-layer masking element 720 is formed over the mandrel structure 300, where the multi-layer masking element 720 may include a BARC 722, an HM 724 disposed over the BARC 722, and a photosensitive layer 726 disposed over the HM 724. Each layer of the multi-layer masking element 720 may be similar to their counterparts in the multi-layer masking element 520 illustrated in FIG. 7. In some examples, the concentrations of benzene and hydroxyl groups in the BARC 722 may not be limited to greater than 30% and 10%, respectively. This is because the multi-layer masking element 720 and the multi-layer masking element 520 are configured to protect their corresponding underlying structures against different etchants used in different subsequent processes. For example, the multi-layer masking element 520 is configured to protect its underlying structures against hydrofluoric acid used to remove the exposed portions of the protective layer 420 during the etching process 610 and/or phosphoric acid used to remove the exposed second mandrels 340 during the etching process 620, while the multi-layer masking element 720 may be configured to protect its underlying structures against an etchant used to remove any exposed first mandrels 320 as explained in detail below.

Figure 14:
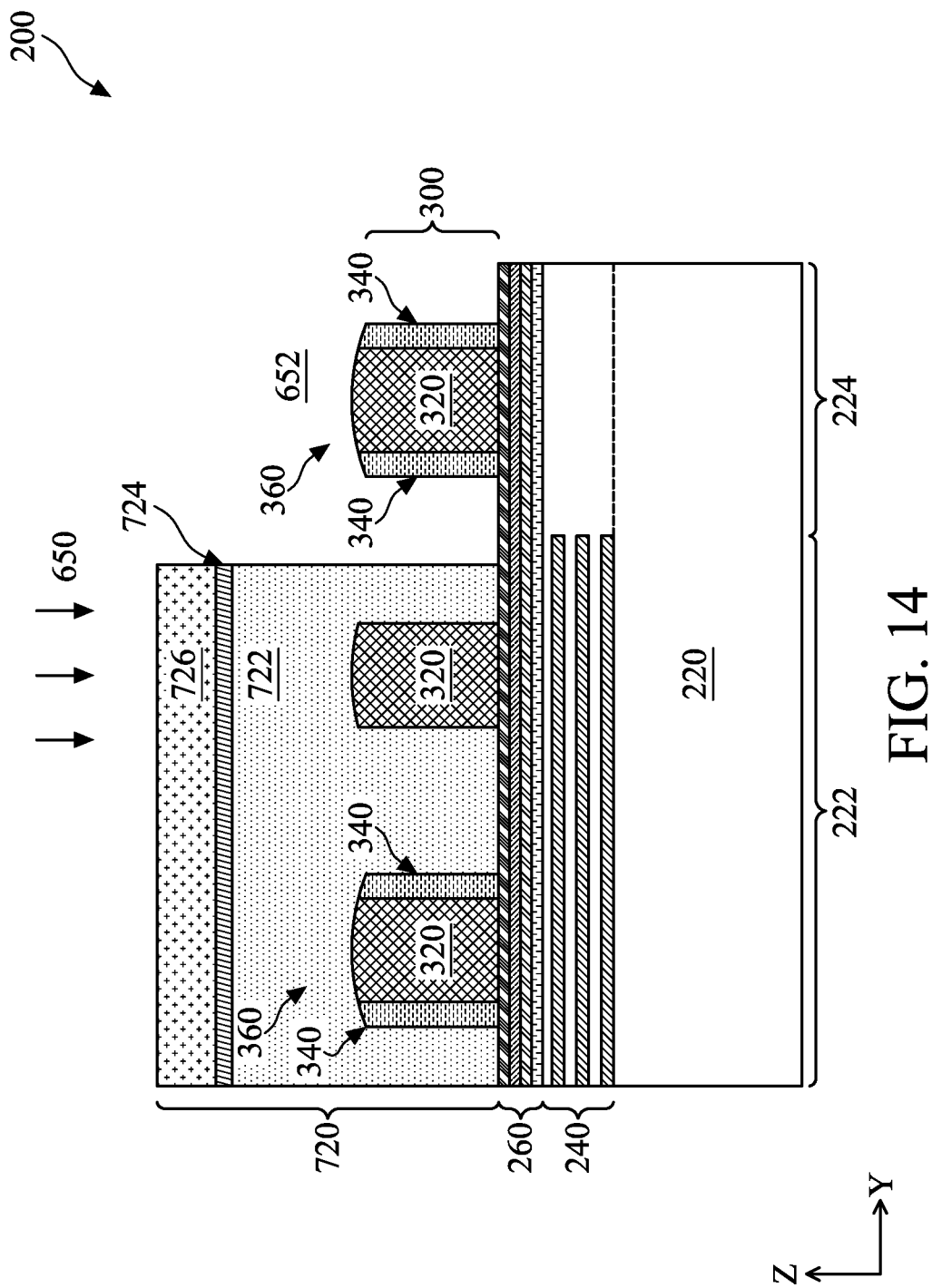

Referring to FIG. 14, The multi-layer masking element 720 is patterned in a patterning process 650 to expose a composite mandrel 360 in an opening 652. In the depicted embodiments, the opening 652 exposes a portion of the device region 224 of the substrate 220. The patterning process 650 may be substantially similar to the patterning process 600 discussed above in reference to FIG. 8.

Figure 15:
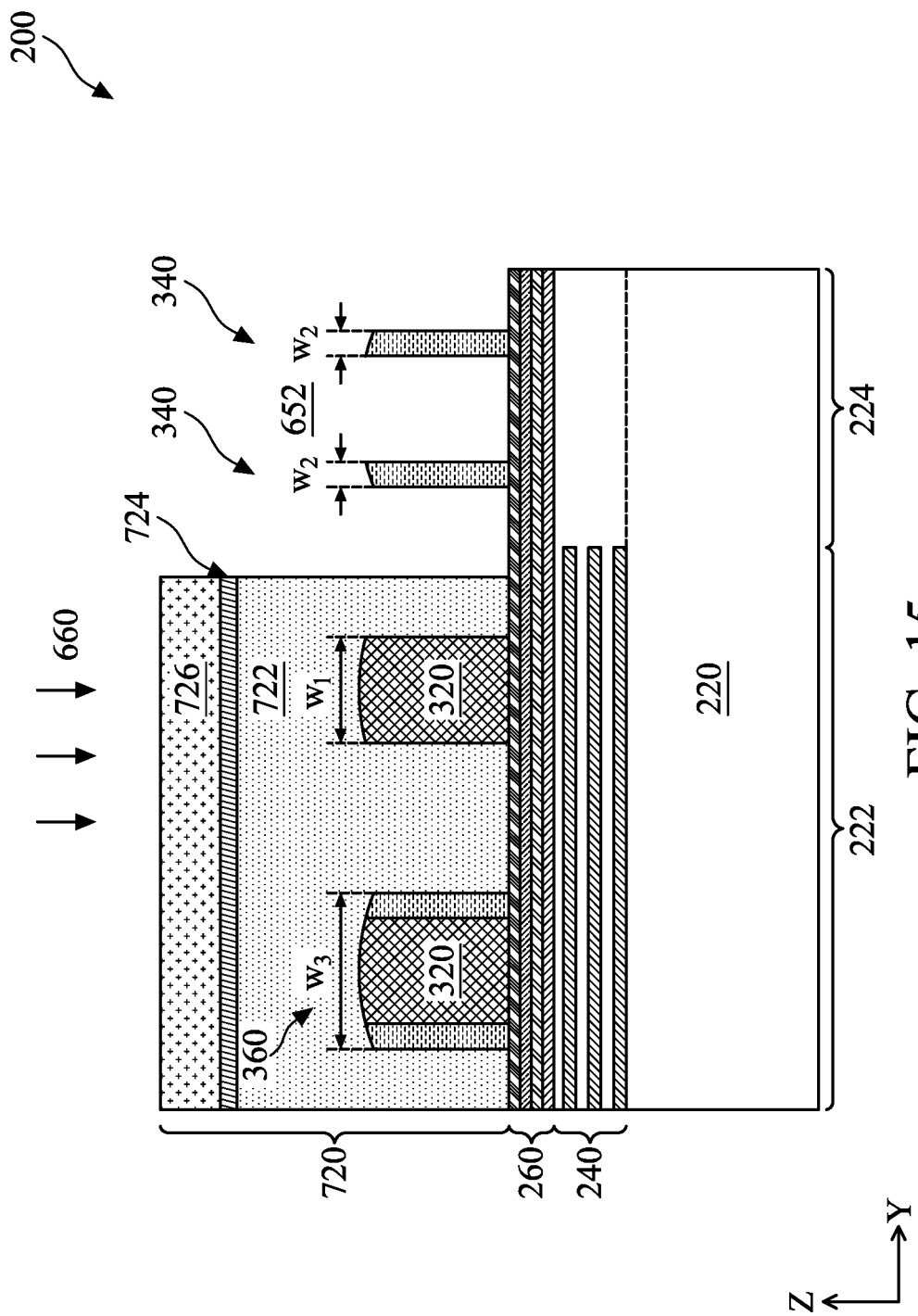

Referring to FIG. 15, the exposed first mandrel 320 of the exposed composite mandrel 360 is removed in an etching process 660. In some embodiments, the etching process 660 includes a wet etch, a dry etch, and/or any other suitable etching processes. In the present embodiments, the etching process 660 is configured to selectively remove the exposed first mandrel 320 without etching, or substantially etching, the exposed second mandrels 340. In an example embodiment, the etching process 660 implements an anisotropic dry etch to remove the exposed first mandrel 320, leaving behind two second mandrels 340 as portions of the mandrel structure 300. The second mandrels 340 in the opening 652 after removing the respective first mandrel 320 are referred as stand-alone second mandrels 340 hereafter for simplicity and clarity. The choice of forming the stand-alone second mandrels 340 in pair or only on one side of the first mandrel 320 provides process flexibility regarding the locations of the mandrels. Subsequently, referring to FIG. 16, the patterned multi-layer masking element 720 is removed in a process 670. The process 670 may be similar to the process 630 discussed above with respect to FIG. 11 and may be implemented by, for example, plasma ashing, resist stripping, and/or other suitable methods.

Figure 16:
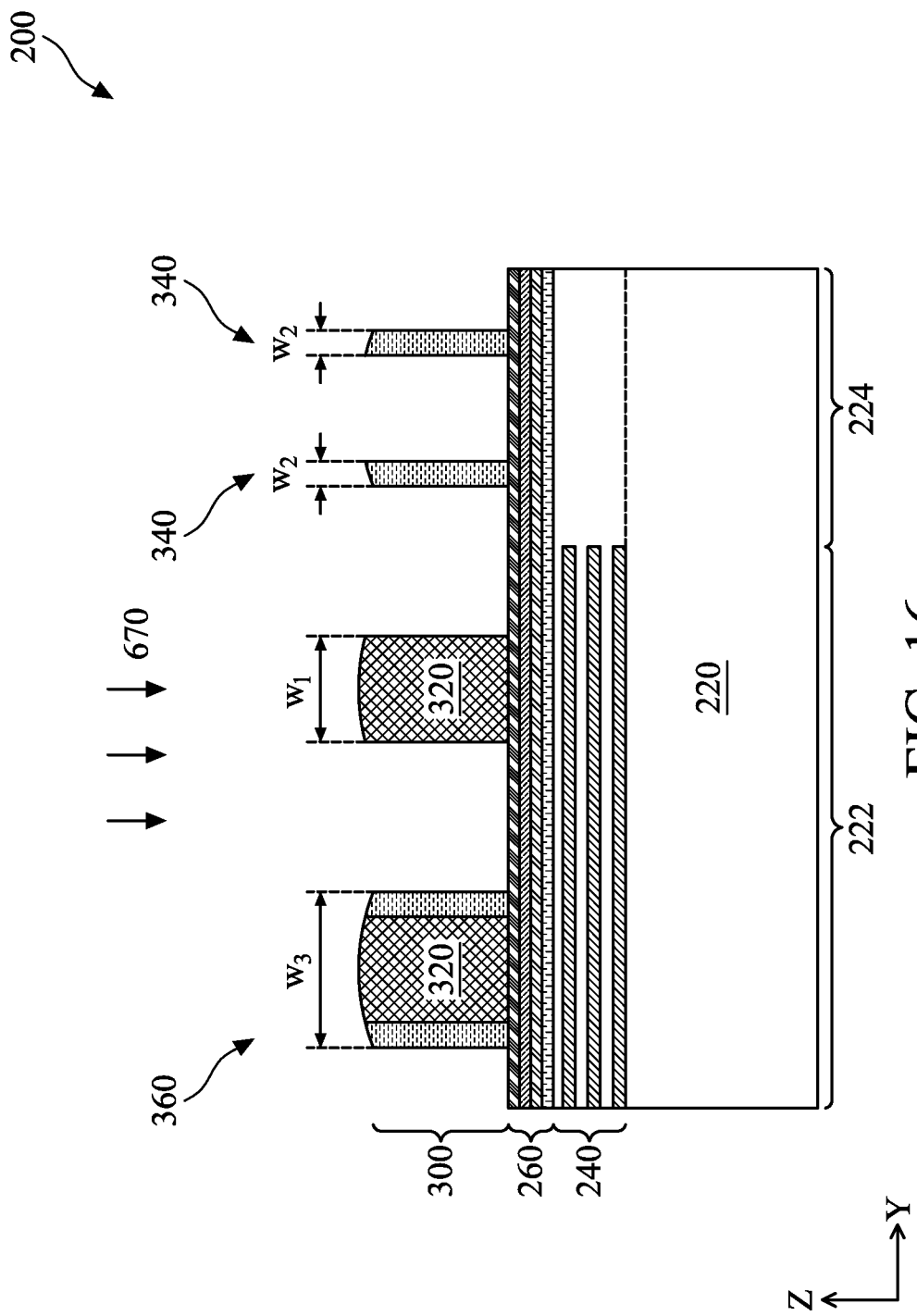

In the depicted embodiments, still referring to FIG. 16, after removing the patterned multi-layer masking element 720, the mandrel structure 300 now includes the stand-alone first mandrel 320 having the width $w_1$, the stand-alone second mandrels 340 each having the width $w_2$, and the composite mandrel 360 having the width $w_3$. In the present embodiments, the width $w_2$ is less than the width $w_1$, which is less than the width $w_3$. In some examples, the width $w_1$ may be about 25 nanometers to about 45 nanometers, such as about 35 nanometers. In some examples, the width $w_2$ may be about 5 nanometers to about 10 nanometers, such as about 6 nanometers. In further examples, a ratio of $w_2$ to $w_1$ may be about 0.1 to about 0.4. Of course, other dimensions of the mandrels 320 and 340 may also be applicable as they are configured to provide different devices according to specific design requirements. For example, the width $w_1$ may be selected based on a desired critical dimension (CD) of a fin configured to form an NS FET, and the width $w_2$ may be selected based on a desired CD of a fin configured to form a FinFET.

Figure 17:
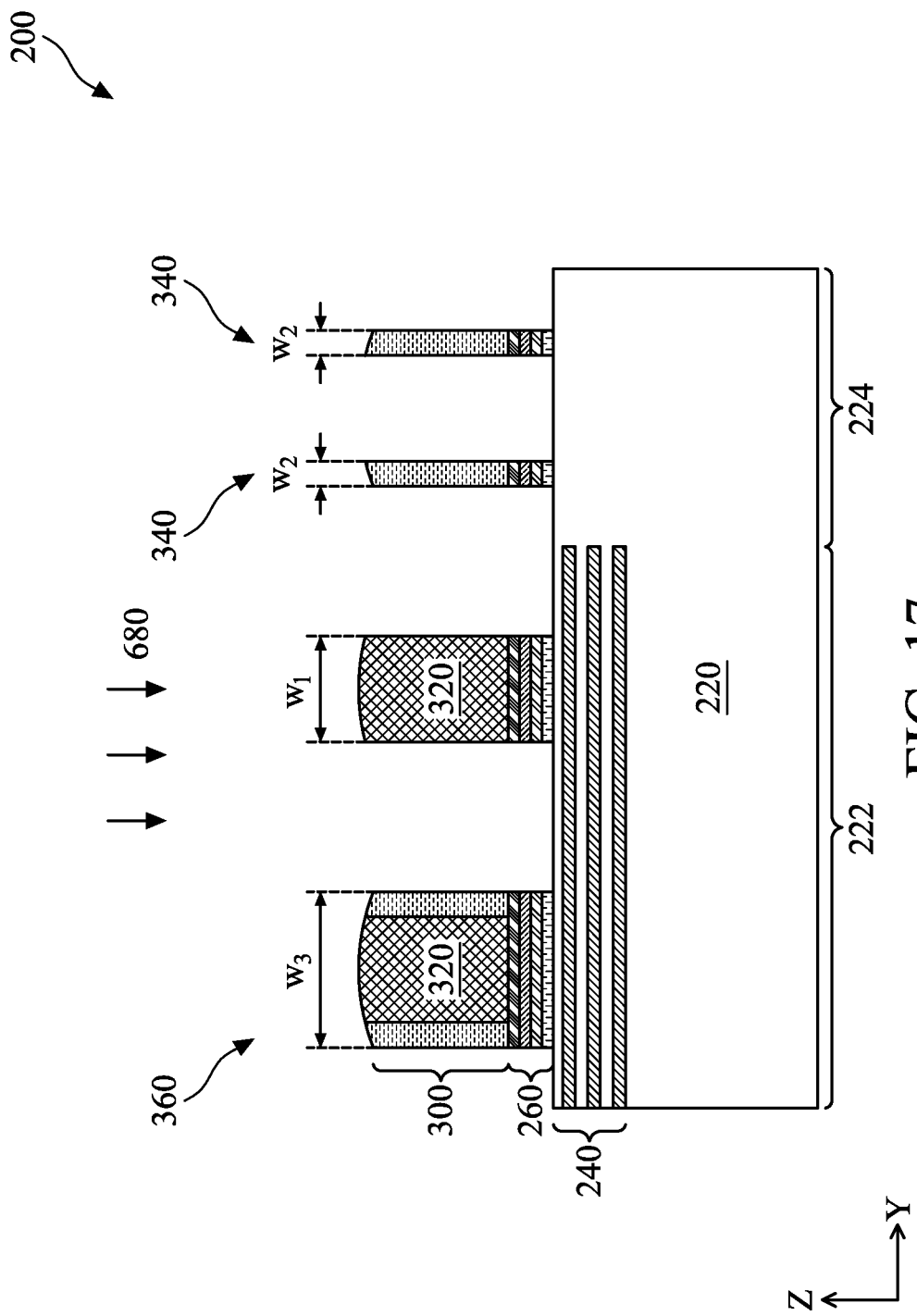

Referring now to FIGS. 1 and 17, the method 100 proceeds to step 108 by patterning the HMs 260 in an etching process 680 using the mandrel structure 300 as an etching mask. The mandrels having different widths $w_1$, $w_2$ and $w_3$ are therefore transferred to the HMs 260. In some embodiments, the etching process 380 may include one or more dry (plasma) etch, a wet etch, and/or other suitable etching processes, where choices of etching methods and etchants may depend upon the compositions of the various layers of the HMs 260. In some instances, the mandrel structure 300 may be partially or completely consumed during the etching process 680.

Figure 18:
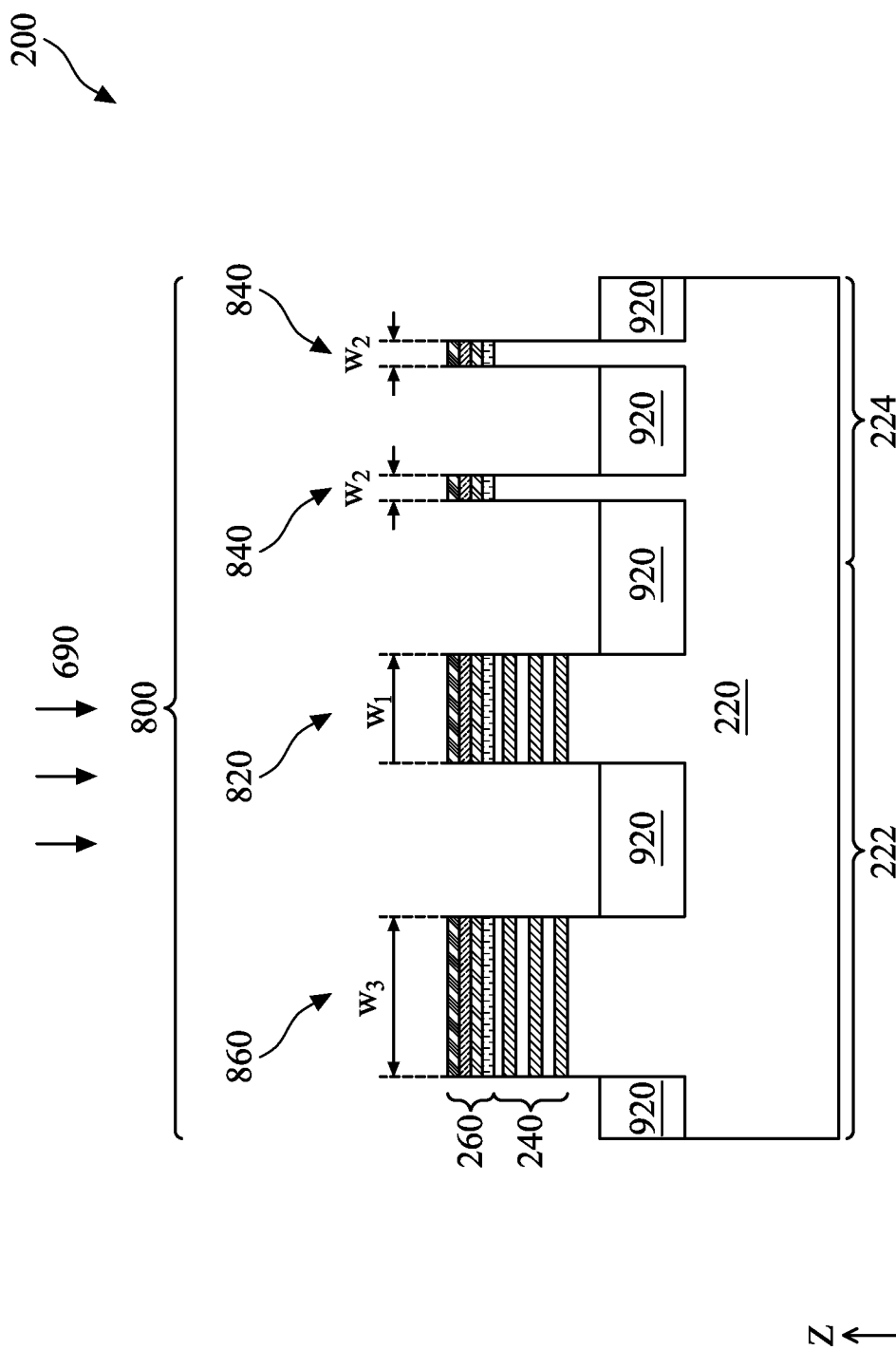

Subsequently, referring to FIGS. 1 and 18, the method 100 proceeds to step 110 by patterning the stack 240 and the substrate 220 to form various fins in a fin structure 800 in an etching process 690. In the depicted embodiments, the fin structure 800 includes at least a first fin (or nanosheet fin) 820 having the width $w_1$, a second fin 840 having the width $w_2$, and a third fin 860 having the width $w_3$, the widths of which are transferred from the patterned HMs 260. Notably, the first fin 820 and the third fin 860, which are both wider than the second fin 840, each include the stack 240, while the second fin 840 includes a uniform, single semiconductor layer structure. As provided herein, the first fin 820 and the third fin 860 may be configured to form NS FETs, while the second fin 840 may be configured to form a FinFET. In this regard, portions of the stack 240 may be subsequently removed to form openings in which a metal gate stack may be formed to form the NS FETs. In some embodiments, the etching process 690 includes one or more dry etch, wet etch, RIE and/or other suitable etching processes.

Subsequently, the method 100 proceeds to step 112 by performing additional fabrication steps. In some embodiments, as depicted in FIG. 18, the method 100 forms isolation structures, such as shallow trench isolations (STI) 920, over the substrate 220 to separate bottom portions of the fins (e.g., the first fin 820, the second fin 840, and the third fin 860) in the fin structure 800. In an example embodiment, a dielectric material for the isolation structures 920 may be first deposited over the fin structure 800 to fill the trenches between the fins. In some embodiments, the isolation structures 920 include silicon oxide, fluorine-doped silicate glass (FSG), a low-k dielectric material, and/or other suitable materials. In some embodiments, the dielectric material used to form the isolation structures 920 may be deposited by a CVD process, a flowable CVD process, a spin-on-glass (SOG) process, and/or other suitable processes. The deposited dielectric material is then thinned and planarized, for example by a chemical mechanical polishing (CMP) process, until at least a portion of the HMs 260 is exposed. The planarized dielectric material is further recessed or etched back by a dry etching process, a wet etching process, and/or other suitable processes to form the isolation structures 920 surrounding the bottom portions of the fins in the fin structure 800. In some embodiments, as illustrated in FIG. 18, the mandrel structure 300 is removed by the CMP process.

The method 100 may further perform additional fabrication steps including, for example, forming a placeholder gate (dummy gate) stack over the fins of the fin structure 800, forming source/drain structures over the fins in the fin structure 800, replacing the placeholder gate stack with a metal gate stack, forming interconnect structures, and/or any other suitable additional fabrication steps.

Although not intended to be limiting, one or more embodiments of the present disclosure provide many benefits to a semiconductor structure and the formation thereof. The present disclosure provides methods of forming a mandrel structure having mandrels with various widths, where the mandrel structure is subsequently used to pattern fins configured to form NS FETs or FinFETs. Embodiments of the present disclosure includes using a wet etching method to selectively remove narrower mandrels (e.g., SiN-containing mandrels) from sidewalls of wider mandrels, where the narrower and the wider mandrels differ in composition. In the present embodiments, the wet etching method employing phosphoric acid demonstrates improved etching selectivity towards the narrower mandrels, while keeping the wider mandrels and other surrounding components substantially intact. The remaining wider mandrels, which form a portion of the mandrel structure, may each be defined by substantially uniform width from the top to the bottom portion of the mandrel. In some embodiments, the wet etching method also reduces the height loss of the wider mandrels as well as the loss to an underlying HM. Accordingly, the methods provided herein allow the mandrels to retain their desired dimensions, which result in fins with improved CDs in line with their respective desired values. In the present embodiments, a protective layer and a multi-layer masking element are provided to protect the mandrels not intended to be etched from possible damage of the phosphoric acid utilized during the wet etching process.

In one aspect, the present disclosure provides a method that includes forming a semiconductor substrate, forming hard mask layers (HMs) over the semiconductor substrate, forming first mandrels over the HMs, forming second mandrels along sidewalls of the first mandrels, where the second mandrels differ from the first mandrels in composition, forming a protective layer over the first mandrels and the second mandrels, removing a portion of the protective layer to expose portions of the first and the second mandrels, removing the exposed portions of the second mandrels with respect to the exposed portions of the first mandrels, and removing remaining portions of the protective layer to expose remaining portions of the first and second mandrels, where the exposed portions of the first mandrels and the remaining portions of the first and second mandrels form a mandrel structure. Thereafter, the method patterns the HMs using the mandrel structure as an etching mask and patterns the semiconductor substrate to form a fin structure using the patterned HMs as an etching mask.

In another aspect, the present disclosure provides a method that includes forming a semiconductor substrate having a stack of alternating first semiconductor layers and second semiconductor layers different from the first semiconductor layers, depositing a first hard mask layer (HM) over the semiconductor substrate, forming first mandrels over the first HM, forming second mandrels on sidewalls of the first mandrels, where the second mandrels differ from the first mandrels in composition, and depositing a second HM over the first mandrels and the second mandrels, where the second HM differs from the first HM in composition. The method then proceeds to patterning the second HM to expose portions of the first and second mandrels disposed over the stack in a first etching process, and selectively removing the exposed portions of the second mandrels without removing the first HM or the exposed portions of the first mandrels in a second etching process. Thereafter, the method removes the patterned second HM to form a mandrel structure, etches the first HM using the mandrel structure as a mask, and then etches the semiconductor substrate using the etched first HM as a mask in a third etching process.

In yet another aspect, the present disclosure provides a method including forming a semiconductor substrate, forming hard mask layers (HMs) over the semiconductor substrate, forming amorphous silicon spacers each defined by a first width over the HMs, forming silicon nitride spacers on sidewalls of the amorphous silicon spacers to form composite spacers, where each silicon nitride spacer is defined by a second width, each composite spacer is defined by a third width, and the second width is less than the first width, then depositing a protective layer over the composite spacers, forming a patterned masking element over the protective layer to expose a portion of the protective layer in an opening, and removing the portion of the protective layer exposed in the opening. Thereafter, the method removes the silicon nitride spacers from the sidewalls of the amorphous silicon spacers exposed in the opening, removes the patterned masking element to expose remaining portions of the protective layer, and removes the remaining portions of the protective layer, resulting in a spacer structure that includes remaining portions of the composite spacers and the amorphous silicon spacers free of the silicon nitride spacers disposed thereon. The method then proceeds to patterning the HMs using the spacer structure as a mask and forming a fin structure in the semiconductor substrate using the patterned HMs as a mask, where the forming of the fin structure includes forming a first fin defined by the first width and a second fin defined by the third width.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    forming a semiconductor substrate;
    forming hard mask layers (HMs) over the semiconductor substrate;
    forming first mandrels over the HMs;
    forming second mandrels along sidewalls of the first mandrels, wherein the second mandrels differ from the first mandrels in composition;
    forming a protective layer over the first mandrels and the second mandrels;
    removing a portion of the protective layer to expose portions of the first and the second mandrels;
    removing the exposed portions of the second mandrels with respect to the exposed portions of the first mandrels;
    removing remaining portions of the protective layer to expose remaining portions of the first and second mandrels, wherein the exposed portions of the first mandrels and the remaining portions of the first and second mandrels form a mandrel structure;
    patterning the HMs using the mandrel structure as an etching mask; and
    patterning the semiconductor substrate to form a fin structure using the patterned HMs as an etching mask.

2. The method of claim 1, wherein the removing of the portion of the protective layer includes:
    forming a multi-layer masking element over the protective layer;
    patterning the multi-layer masking element to expose the portion of the protective layer;
    removing the portion of the protective layer using a wet etching process, wherein the wet etching process utilizes hydrofluoric acid (HF) having a concentration of about 0.2%; and
    removing the patterned multi-layer masking element to expose the remaining portions of the protective layer.

3. The method of claim 2, wherein the forming of the multi-layer masking element includes:
    depositing a bottom anti-reflective coating (BARC) over the protective layer, wherein the BARC includes about 30% benzene and about 10% hydroxyl groups;
    depositing a lithography HM over the BARC; and
    depositing a photosensitive layer over the lithography HM, thereby forming the multi-layer masking element.

4. The method of claim 1, wherein the forming of the protective layer includes:
    forming a silicon oxide layer over the first and the second mandrels; and
    forming a carbon layer over the silicon oxide layer, wherein a thickness of the carbon layer is less than a thickness of the silicon oxide layer.

5. The method of claim 1, wherein the second mandrels include silicon nitride, and wherein the first mandrels include amorphous silicon but is free of silicon nitride.

6. The method of claim 1, wherein the removing of the exposed portions of the second mandrels utilizes phosphoric acid ($H_3PO_4$) as a wet etchant to selectively remove the exposed portions of the second mandrels with respect to the exposed portions of the first mandrels and the HMs.

7. The method of claim 1, further comprising, after the removing of the remaining portions of the protective layer and before the patterning of the HMs:
    forming a masking element over the remaining portions of the first and second mandrels;
    patterning the masking element to form an opening; and selectively removing the first mandrels exposed in the opening with respect to the second mandrels.

8. A method, comprising:
forming a semiconductor substrate having a stack of alternating first semiconductor layers and second semiconductor layers different from the first semiconductor layers;
depositing a first hard mask layer (HM) over the semiconductor substrate;
forming first mandrels over the first HM;
forming second mandrels on sidewalls of the first mandrels, wherein the second mandrels differ from the first mandrels in composition;
depositing a second HM over the first mandrels and the second mandrels, wherein the second HM differs from the first HM in composition;
patterning the second HM to expose portions of the first and second mandrels disposed over the stack in a first etching process;
selectively removing the exposed portions of the second mandrels without removing the first HM or the exposed portions of the first mandrels in a second etching process;
after selectively removing the exposed portions of the second mandrels, removing the patterned second HM to form a mandrel structure;
etching the first HM using the mandrel structure as a mask; and
etching the semiconductor substrate using the etched first HM as a mask in a third etching process.

9. The method of claim 8, wherein the patterning of the second HM includes:
forming a photosensitive mask over the second HM;
patterning the photosensitive mask to expose a portion of the second HM;
removing the exposed portion of the second HM utilizing hydrofluoric acid (HF) as an etchant in the first etching process, wherein the hydrofluoric acid (HF) has a concentration of about 2%; and
removing the patterned photosensitive mask after selectively removing the exposed portions of the second mandrels.

10. The method of claim 9, wherein the forming of the photosensitive mask includes:
depositing a first mask layer over the second HM, wherein the first mask layer includes about 30% benzene and about 10% hydroxyl groups;
depositing a second mask layer over the first mask layer; and
depositing a photoresist layer over the second mask layer, thereby forming the photosensitive mask.

11. The method of claim 8, wherein the second mandrels include silicon nitride, and wherein the second etching process is a wet etching process that utilizes phosphoric acid ($H_3PO_4$) as an etchant.

12. The method of claim 8, wherein the depositing of the second HM includes:
depositing a silicon oxide layer over the first mandrels and the second mandrels; and
depositing a carbon coating over the silicon oxide layer, wherein a thickness of the carbon coating is smaller than a thickness of the silicon oxide layer.

13. The method of claim 8, wherein the depositing of the first HM includes:
depositing a first oxide layer over the semiconductor substrate;
depositing a nitride layer over the first oxide layer;
depositing a second oxide layer over the nitride layer using chemical vapor deposition method; and
depositing a third oxide layer over the second oxide layer utilizing atomic layer deposition method.

14. The method of claim 8, wherein the exposed portions of the first and second mandrels are first exposed portions of the first and second mandrels, the method further comprising, after the removing of the patterned second HM and before the etching the first HM:
depositing a multi-layer photosensitive mask over the mandrel structure;
patterning the multi-layer photosensitive mask to expose second portions of the first and second mandrels; and
selectively removing the second exposed portions of the first mandrels without removing the second exposed portions of the second mandrels, such that the second exposed portions of the second mandrels form portions of the mandrel structure.

15. A method, comprising:
forming a semiconductor substrate;
forming hard mask layers (HMs) over the semiconductor substrate;
forming amorphous silicon spacers each defined by a first width over the HMs;
forming silicon nitride spacers on sidewalls of the amorphous silicon spacers to form composite spacers, wherein each silicon nitride spacer is defined by a second width, wherein each composite spacer is defined by a third width, and wherein the second width is less than the first width;
depositing a protective layer over the composite spacers;
forming a patterned masking element over the protective layer to expose a portion of the protective layer in an opening;
removing the portion of the protective layer exposed in the opening;
thereafter, removing the silicon nitride spacers from the sidewalls of the amorphous silicon spacers exposed in the opening;
removing the patterned masking element to expose remaining portions of the protective layer;
removing the remaining portions of the protective layer, resulting in a spacer structure that includes remaining portions of the composite spacers and the amorphous silicon spacers free of the silicon nitride spacers disposed thereon;
patterning the HMs using the spacer structure as a mask; and
forming a fin structure in the semiconductor substrate using the patterned HMs as a mask, wherein the forming of the fin structure includes forming a first fin defined by the first width and a second fin defined by the third width.

16. The method of claim 15, wherein the removing of the portion of the protective layer employs hydrofluoric acid (HF) as an etchant, and wherein hydrofluoric acid (HF) has a concentration of about 0.2%.

17. The method of claim 15, wherein the removing of the silicon nitride spacers employs phosphoric acid ($H_3PO_4$) as an etchant, and wherein the phosphoric acid ($H_3PO_4$) removes the silicon nitride spacers without removing the amorphous silicon spacers or the HMs.

18. The method of claim 15, further comprising, after the forming of the protective layer and before the forming of the patterned masking element, depositing a carbon layer on the protective layer, such that the removing of the portion of the protective layer in the opening removes a portion of the carbon layer, wherein a thickness of the carbon layer is less than a thickness of the protective layer.

19. The method of claim 15, wherein the semiconductor substrate includes a single-layer region and a multi-layer region of alternating first semiconductor layers and second semiconductor layers that are different from the first semiconductor layers, and wherein the first and the second fins are formed in the multi-layer region.

20. The method of claim 19, wherein the patterned masking element is a first patterned masking element, and wherein the opening is a first opening, the method further comprising, after the removing of the remaining portions of the protective layer and before the patterning of the HMs:
- forming a second patterned masking element over the spacer structure to form a second opening, thereby exposing the remaining portions of the composite spacers; and
- selectively removing the amorphous silicon spacers exposed in the second opening with respect to the silicon nitride spacers, such that the forming of the fin structure further includes forming a third fin defined by the second width, wherein the third fin is formed in the single-layer region.

* * * * *